US006982460B1

(12) United States Patent
Cohen et al.

(10) Patent No.: US 6,982,460 B1
(45) Date of Patent: Jan. 3, 2006

(54) SELF-ALIGNED GATE MOSFET WITH SEPARATE GATES

(75) Inventors: Guy M. Cohen, Mohegan Lake, NY (US); Hon-Sum P. Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/612,260

(22) Filed: Jul. 7, 2000

(51) Int. Cl.
*H01L 29/76* (2006.01)
*H01L 27/01* (2006.01)

(52) U.S. Cl. ....................... 257/331; 257/328; 257/329; 257/330; 257/332; 257/350; 438/158; 438/164; 438/404; 438/435

(58) Field of Classification Search ......... 257/328–331, 257/347, 332, 350, 351, 365, 366, 57, 59, 257/67, 82, 5, 69, 72; 438/158, 164, 404, 438/406, 435, 459
See application file for complete search history.

(56) References Cited

U.S. PATENT DOCUMENTS 4,488,162 A 12/1984 Jambotkar
5,102,819 A 4/1992 Matsushita et al.
5,120,666 A * 6/1992 Gotou .......................... 437/40
5,166,084 A * 11/1992 Pfiester ........................ 437/40

(Continued)

FOREIGN PATENT DOCUMENTS

EP 0 043 944 A2 6/1981
JP 64-53460 3/1989
JP 2-54966 2/1990
JP 2-294076 12/1990

(Continued)

OTHER PUBLICATIONS

Wong et al., "Self–Aligned (Top and Bottom) Double–Gate MOSFET with a 25 nm Thick Silicon Channel", IEDM 97, pp 427–430.*

Wong, et al., "Self–Aligned (Top and Bottom) Double–Gate MOSFET with a 25 nm Thick Silicon Channel", Electron Devices Meeting, 1997, Technical Digest, International, 1997, pp. 427–430.

Lee et al., "Super Self–Aligned Double–Gate (SSDG) MOSFETs Utilizing Oxidation Rate Difference ADN Selective Epitaxy", IEDM, Dec. 5, 1999, IEEE, 1999.

Su et al., New Planar Self–Aligned Double–Gate Fully–Depleted P–MOSFET's Using Epitaxial Lateral Overgrowth (ELO) and Selectively Grown Source/Drain (S/D), IEEE SOI Conference, Oct., 2000.

*Primary Examiner*—Donghee Kang
(74) *Attorney, Agent, or Firm*—McGinn & Gibb, PLLC; Wan Yee Cheung, Esq.

(57) ABSTRACT

A structure and method of manufacturing a double-gate integrated circuit which includes forming a laminated structure having a channel layer and first insulating layers on each side of the channel layer, forming openings in the laminated structure, forming drain and source regions in the openings, removing portions of the laminated structure to leave a first portion of the channel layer exposed, forming a first gate dielectric layer on the channel layer, forming a first gate electrode on the first gate dielectric layer, removing portions of the laminated structure to leave a second portion of the channel layer exposed, forming a second gate dielectric layer on the channel layer, forming a second gate electrode on the second gate dielectric layer, doping the drain and source regions, using self-aligned ion implantation, wherein the first gate electrode and the second gate electrode are formed independent of each other.

37 Claims, 24 Drawing Sheets

U.S. PATENT DOCUMENTS

| | | | | | |
|---|---|---|---|---|---|
| 5,266,515 | A | | 11/1993 | Robb et al. | |
| 5,273,921 | A | | 12/1993 | Neudeck et al. | |
| 5,296,727 | A | | 3/1994 | Kawai et al. | |
| 5,349,228 | A | | 9/1994 | Neudeck et al. | |
| 5,371,401 | A | * | 12/1994 | Kurita | 257/524 |
| 5,646,058 | A | * | 7/1997 | Taur et al. | 438/283 |
| 5,708,286 | A | * | 1/1998 | Uesugi et al. | 257/330 |
| 5,818,070 | A | | 10/1998 | Yamazaki et al. | |
| 5,834,797 | A | * | 11/1998 | Yamanaka | 257/57 |
| 6,037,204 | A | | 3/2000 | Chang et al. | |
| 6,143,582 | A | | 11/2000 | Vu et al. | |
| 6,188,111 | B1 | * | 2/2001 | Kumagai | 257/369 |

FOREIGN PATENT DOCUMENTS

| | | | |
|---|---|---|---|
| JP | 05-226655 | * | 9/1993 |
| JP | 8-023100 | | 1/1996 |
| JP | 11-330482 | | 11/1999 |

* cited by examiner

SELF-ALIGNED GATE MOSFET WITH SEPARATE GATES

BACKGROUND OF THE INVENTION

1. Field of the Invention

The present invention generally relates to a self-aligned double-gate metal oxide semiconductor (DG-MOSFET), with electrically separated top and bottom gates. Moreover, with the invention, the top and bottom gates may be formed by different materials.

2. Description of the Related Art

The double-gate metal oxide semiconductor field effect transistor (DG-MOSFET), is a MOSFET having a top and a bottom gate which control the carriers in the channel. The double-gate MOSFET has several advantages over a conventional single-gate MOSFET: higher transconductance, lower parasitic capacitance, avoidance of dopant fluctuation effects, and superior short-channel characteristics. Moreover, good short-channel characteristics are obtained down to 20 nm channel length with no doping needed in the channel region. This circumvents all the tunneling breakdown, dopant quantization, and impurity scattering problems associated with channel doping.

Conventional systems have attempted to make a double-gate structure with both top and bottom gates self-aligned to the channel region. However, there is no satisfactory method of achieving this self-aligned structure. Previous efforts generally fall into the following categories. A first, category includes etching silicon (Si) into a pillar structure and depositing gates around it (vertical Field Effect Transistor (FET)). A second, category etches a silicon on insulator (SOI) film into a thin bar, makes the source/drain contacts on both ends of the bar, and deposits the gate material on all three surfaces of the thin Si bar. Another way involves making a conventional single-gate MOSFET, then using bond-and-etch back techniques to form the second gate. A fourth conventional method starts with a thin SOI film, patterns a strip and digs a tunnel under it by etching the buried oxide to form a suspended Si bridge. Then, this method deposits the gate material all around the suspended Si bridge.

There are serious drawbacks in all of the above approaches. For example, the first and second require formation of a vertical pillar or Si bar at a thickness of 10 nm and it is difficult to reach this dimension with good thickness control and prevent Reactive Ion Etching (RIE) damage. While in the vertical case (first), it is difficult to make a low series resistance contact to the source/drain terminal which is buried under the pillar. In the lateral case (second), the device width is limited by the Si bar height. In the third case, thickness control and top/bottom gate self-alignment are major problems. In the fourth case, the control over the gate length is poor, and the two gates are electrically connected and must be made of the same material.

A co-pending application by, K. K. Chan, G. M. Cohen, Y. Taur, H. S. P. Wong, entitle "Self-Aligned Double-Gate MOSFET by Selective Epitaxy and Silicon Wafer Bonding Techniques", Ser. No. 09/272,297, filed Mar. 19, 1999 (hereinafter "Chan") incorporated herein by reference, utilizes a method for the fabrication of a double-gate MOSFET structure with both top and bottom gates self-aligned to the channel region. The process circumvents most of the problems discussed above. Yet, the top and bottom gates are still physically connected. This occurs because the gate material is deposited in one processing step as an "all-around the channel" gate.

This may not be desirable in some applications for the following reasons. First, from the circuit design point of view, two electrically separated gates are preferable. Second, the bottom gate and top gate are essentially made of the same material, thus only a symmetric DG-MOSFET may be fabricated. Asymmetric DG-MOSFET in which the bottom gate material is different than the top gate cannot be realized.

Chan discloses forming an "all-around the channel" gate by forming a suspended silicon bridge (the channel) followed by the deposition of the gate material conformally around it. To obtain a good threshold voltage control, the channel thickness should be thinned down to 3–5 nm. It is not clear if such thin bridges can be processed with a high enough yield. Thus, this may impose a limitation on the process suggested in Chan.

Thus, there is a need for a self-aligning DG-MOSFET that is formed by depositing the top and bottom gates independently. Such a structure would produce many advantages. For example, the independent formation of the gates permits the gates to be electrically separated; to be made of varying materials and thickness, and to provide a structure that is planarized, making it easier to connect the device. In addition, there is a need for a DG-MOSFET which permits the formation of a very thin channel.

SUMMARY OF THE INVENTION

It is, therefore, an object of the present invention to provide a structure and method for manufacturing a double-gate integrated circuit which includes forming a laminated structure having a channel layer and first insulating layers on each side of the channel layer, forming openings in the laminated structure, forming drain and source regions in the openings, removing portions of the laminated structure to leave a first portion of the channel layer exposed, forming a first gate dielectric layer on the channel layer, forming a first gate electrode on the first gate dielectric layer, removing portions of the laminated structure to leave a second portion of the channel layer exposed, forming a second gate dielectric layer on the channel layer, forming a second gate electrode on the second gate dielectric layer, doping the drain and source regions, using self-aligned ion implantation, wherein the first gate electrode and the second gate electrode are formed independently of each other.

The gate dielectric is typically made of $SiO_2$ but it can be made of other dielectric materials. Also, the gate dielectric associated with the top gate is independent of the gate dielectric associated for the bottom gate. Thus, the gate dielectrics may be of different thicknesses and materials.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
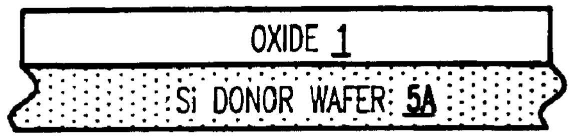
FIG. 1 is a schematic diagram depicting a portion of the depositions and bonding that are used to fabricate a film stack.
Figure 2:
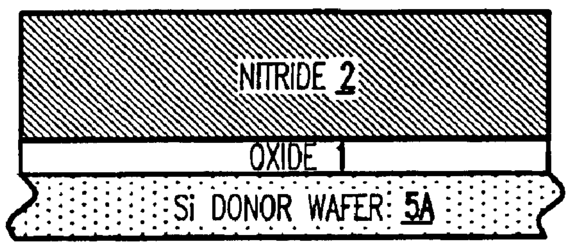
FIG. 2 is a schematic diagram depicting a portion of the depositions and bonding that are used to fabricate a film stack.
Figure 3:
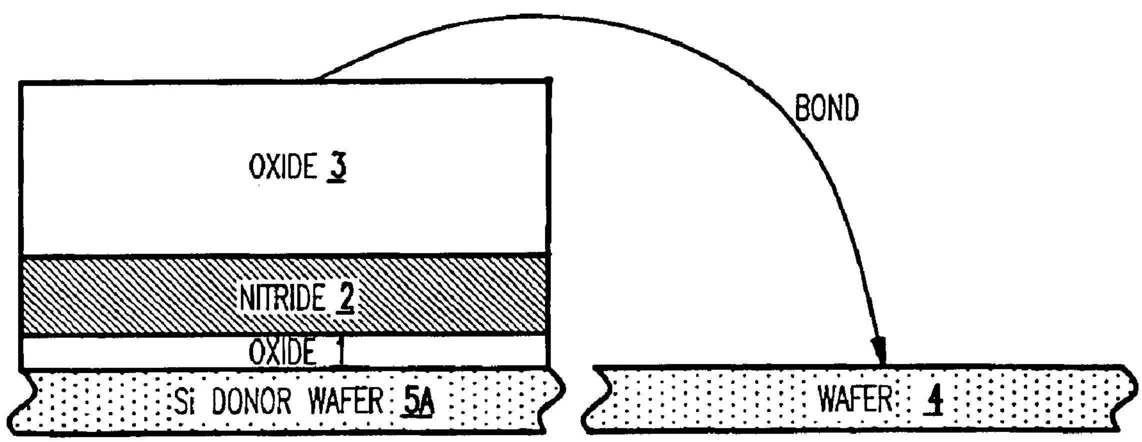
FIG. 3 is a schematic diagram depicting a portion of the depositions and bonding that are used to fabricate a film stack.
Figure 6:
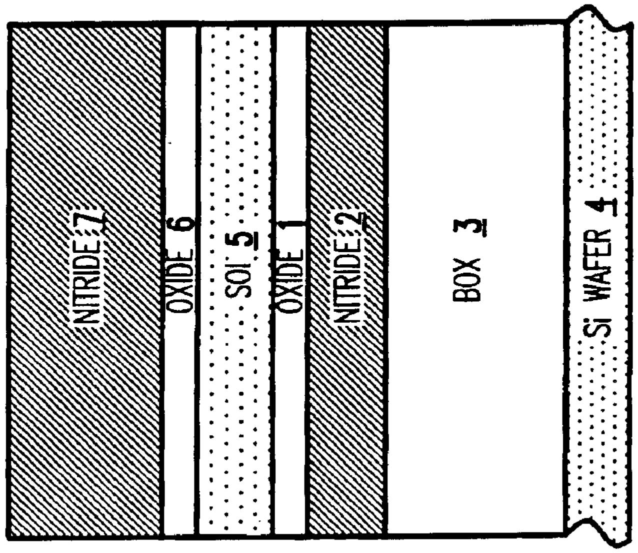
FIG. 6 is a schematic diagram depicting a portion of the depositions and bonding that are used to fabricate a film stack.
Figure 4:
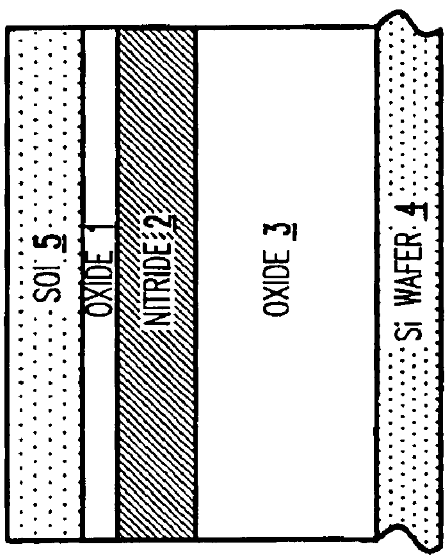
FIG. 4 is a schematic diagram depicting a portion of the depositions and bonding that are used to fabricate a film stack.
Figure 5:
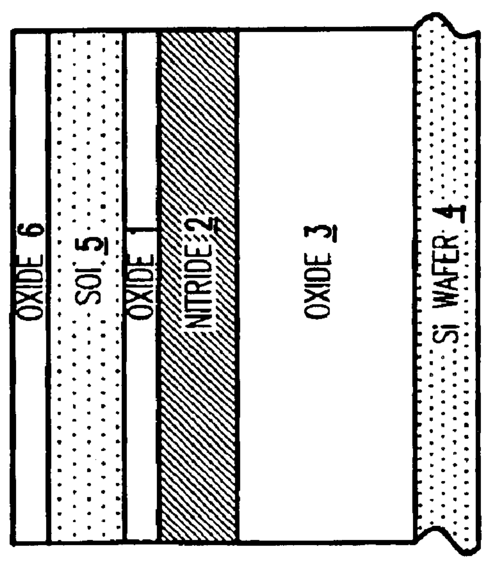
FIG. 5 is a schematic diagram depicting a portion of the depositions and bonding that are used to fabricate a film stack.

The following describes the present invention which is a self-aligned double-gate metal oxide semiconductor (DG-MOSFET), with electrically separated top and bottom gates and method for making the same. Moreover, the top and bottom gates comprise different materials.

As depicted in FIGS. 1–6, the invention begins by forming a series of layers. First, the invention forms a thin silicon dioxide 1 (e.g., about 2 nm thick) onto a single crystal wafer 5A, which is referred to as the donor wafer. Second, a layer of silicon nitride 2 (which can be, for example, approximately 100 nm thick) is formed onto the silicon dioxide layer 1. Third, a thick (e.g., approximately 400 nm) silicon dioxide layer 3 is formed onto the nitride layer 2. Fourth, the crystal wafer is bonded to a handle wafer 4. This bonding is performed using standard silicon wafer bonding techniques such as boron etch stop, smartCut, and other techniques well known to those skilled in the art (for a detailed discussion on bonding techniques see Jean-Pierre Colinge, Silicon-On-Insulator Technology, 2nd Ed, Kluwer Academic Publishers, 1997, incorporated herein by reference). Next, the SOI layer 5 is formed to the required thickness for the MOSFET channel. For example, if the smartCut technique is used then a thin Si layer is transferred from the donor wafer 5A surface onto the handle wafer 4. The transferred Si layer is typically bonded onto an insulating film such as SiO2, and is therefore referred to as silicon-on-insulator (SOI). The thickness of the transferred SOI film is determined by the depth of the hydrogen implant which is part of the smartCut technique. Once the SOI film is transferred onto the handle wafer 4 it can be further thinned by oxidation and stripping. The SOI film thickness is typically monitored by ellipsometry or by x-ray diffraction techniques (see G. M. Cohen et. al, Applied Physics Letters, 75(6), p. 787, August 1999, incorporated herein by reference).

Then, a thin silicon dioxide 6 layer (approximately 2 nm) is formed onto the SOI layer 5. This is followed by the formation of a thick silicon nitride 7 layer (e.g., about 150 nm) onto the silicon dioxide layer 6.

Figure 7:
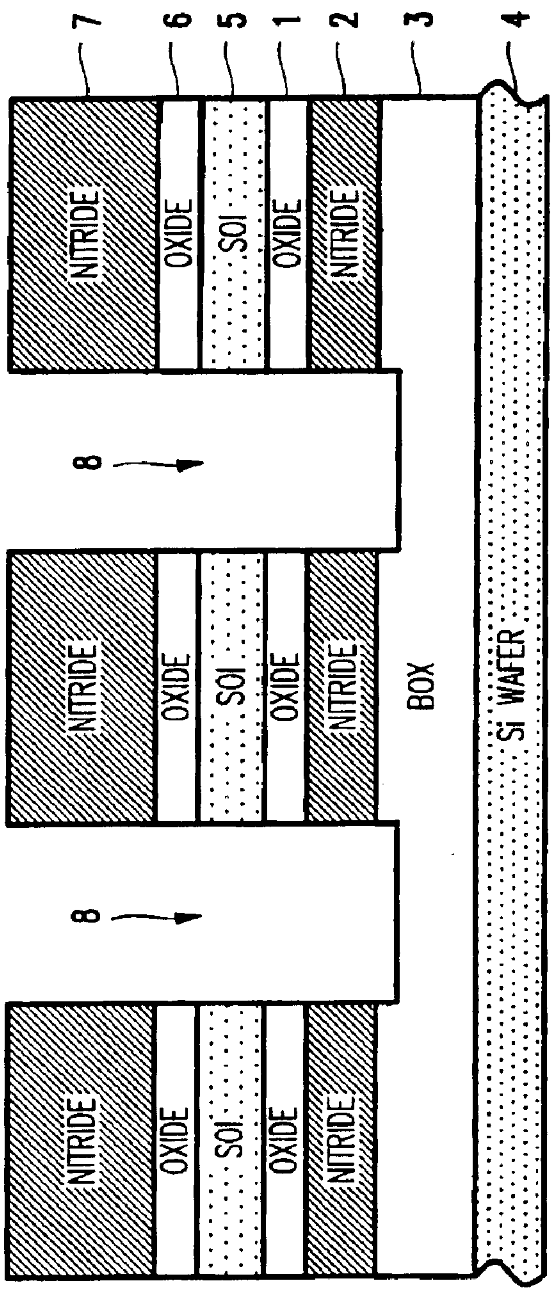
FIG. 7 is a schematic diagram depicting a cross section along line L—L in FIG. 8.
Figure 8:
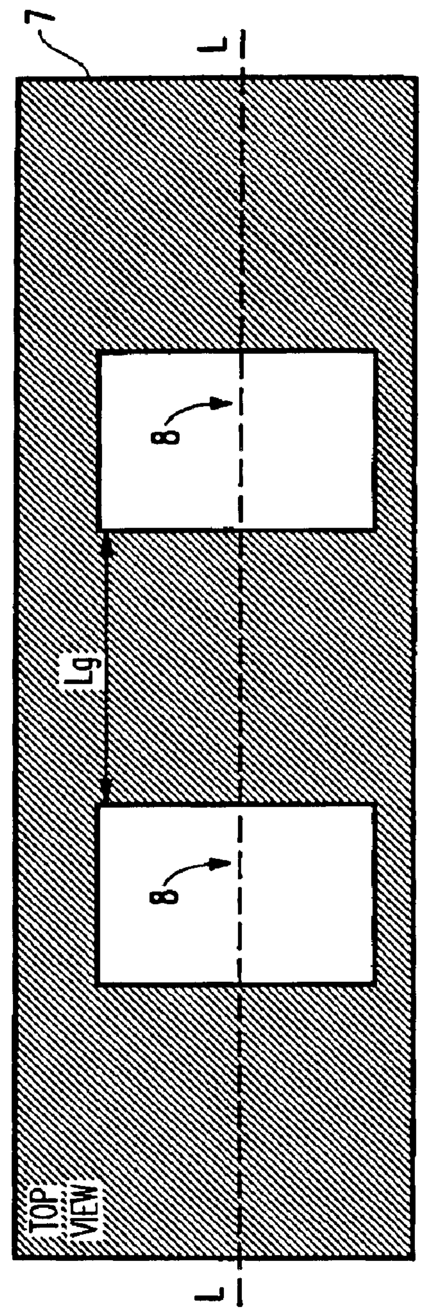
FIG. 8 is a schematic diagram depicting a top view of the DG-MOSFET fabricated according to this invention.

After the first series of layers is completed, the invention etches two regions 8 into the stack of films. As depicted in FIGS. 7 and 8, etch stops (or other similar control features) are positioned some distance into the buried oxide (BOX) 3. The distance between these two regions will become the length (Lg) of the fabricated MOSFET gate.

This disclosure illustrates the inventive structure and process along different cross-sectional lines for clarity. For example, FIGS. 7, 9, 11–18, 20, 21, 23, 25, 27, 29, 31, 33–38, 40, 41, 43, 45 and 47 are schematic diagrams cut along line L—L, of the top view of the structure shown in FIGS. 8 and 9.

Figure 9:
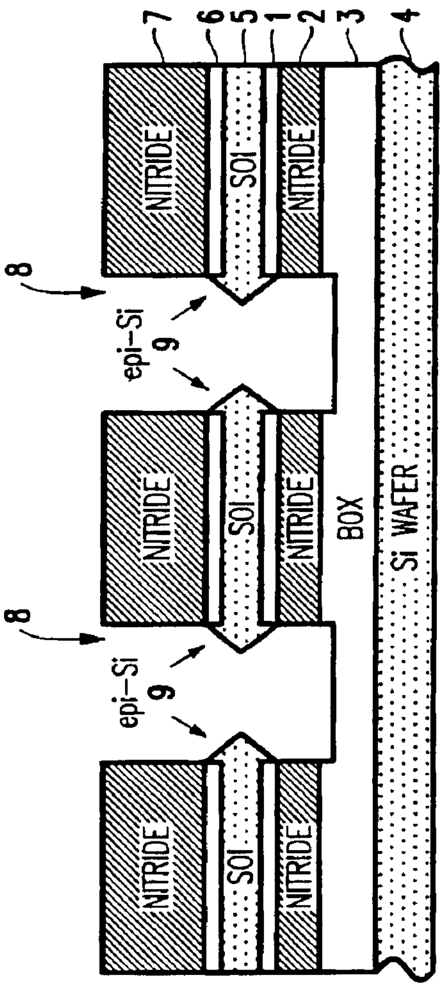
FIG. 9 is a schematic diagram depicting a cross section of FIG. 10 along line L—L.
Figure 10:
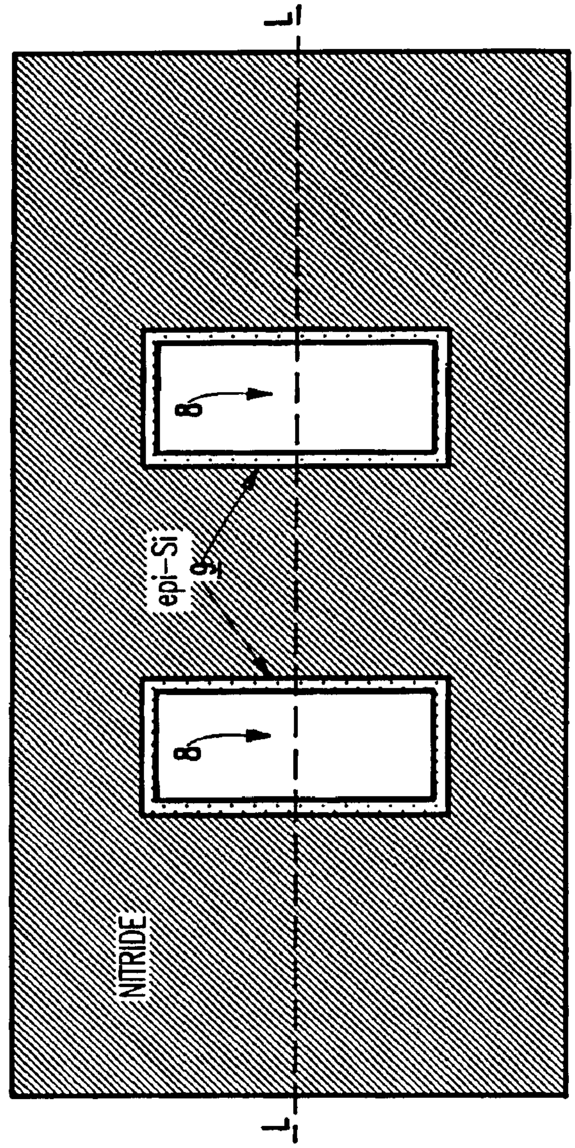
FIG. 10 is a schematic diagram depicting the top view and the of the DG-MOSFET fabricated according to this invention and the extension of the SOI channel into the source and drain regions by epitaxy.

The invention begins a series of steps to reshape the etched regions. First, as depicted in FIGS. 9 and 10, an epitaxial silicon (epi) extension 9 is grown selectively out of the single crystal SOI 5 channel. The epi extension 9 extends into the etched regions 8 and is grown around the entire perimeter of the etched regions. The size of the epi extension 9 is preferably about 50 nm. The extension may also be realized by growth of other alloys such as SiGe, SiGeC or other suitable materials well known to those skilled in the art.

Figure 11:
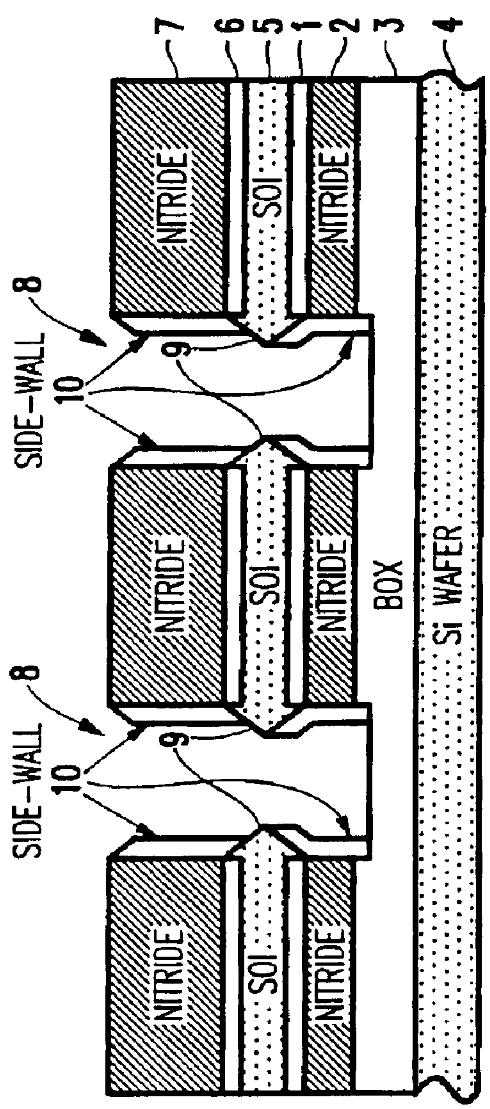
FIG. 11 is a schematic diagram depicting the side-wall spacer.

Next, the invention forms side-wall spacers 10 on the side-walls of the etched regions 8, as shown in FIG. 11. This is performed by depositing a dielectric (not included in the figures) onto the entire structure. The thickness of this dielectric determines the resultant spacer 10 thickness. The dielectric can also be a composite (e.g. subsequent deposition of oxide and nitride layers) to provide etch selectivity. In a preferred embodiment, reactive ion etching is employed to form side wall spacers 10. Also, isotropic etching (reactive ion etching or wet chemical etching) is performed to remove residues of the spacer dielectric from the exposed silicon extension of the SOI channel.

Figure 12:
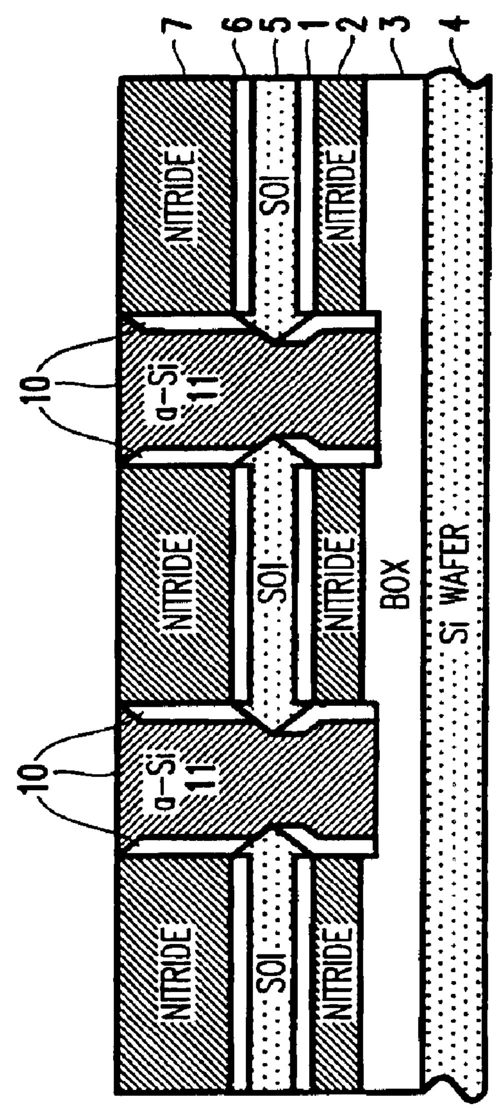
FIG. 12 is a schematic diagram depicting the filling of the source and drain trenches with the source/drain material and its subsequent planarization by CMP.
Figure 13:
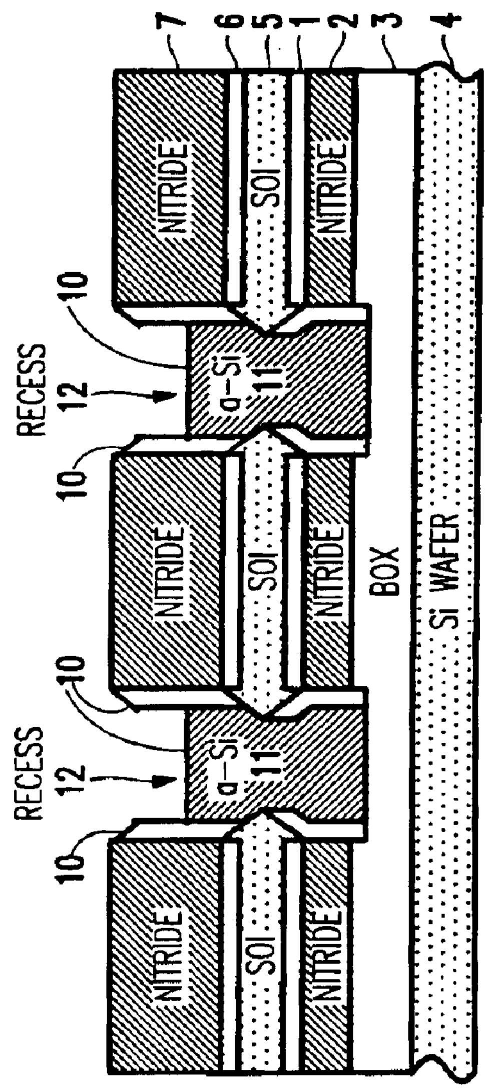
FIG. 13 is a schematic diagram depicting the source and drain recesses.
Figure 14:
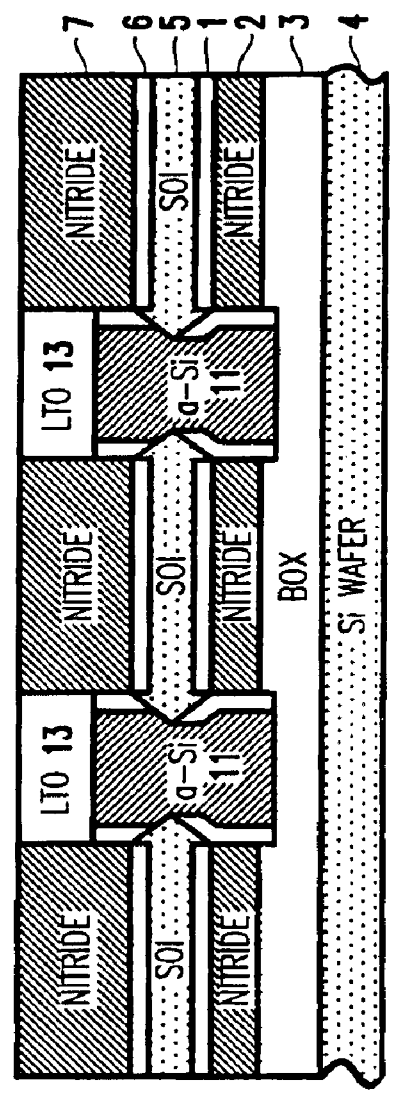
FIG. 14 is a schematic diagram depicting the source and drain recess regions filled with a dielectric material.

Then, as shown in FIG. 12, the invention forms source/drain regions 11. This is done by first depositing amorphous silicon or poly-silicon 11 into the etched regions 8. As depicted in FIG. 12, the amorphous silicon is deposited until the level of amorphous silicon is higher than the top surface of nitride 7. Second, chemical-mechanical polishing (CMP) is used to planarize the top surface. The CMP process mainly removes amorphous-Si and is selective to nitride 7. Next, as depicted in FIG. 13, reactive-ion-etching is used to recess 12 the silicon in the source/drain regions 11. Finally, as shown in FIG. 14, a dielectric 13 (such as oxide) is deposited into the recessed regions 12, such that the dielectric fully conforms to the recessed region 12. Subsequently, the dielectric is planarized by CMP.

Figure 15:
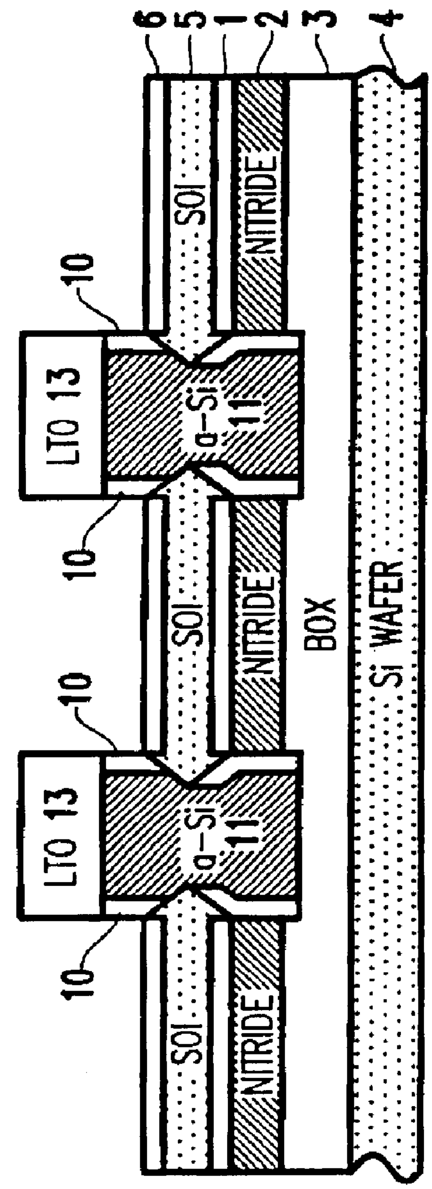
FIG. 15 is a schematic diagram depicting the etching of the top nitride film.
Figure 16:
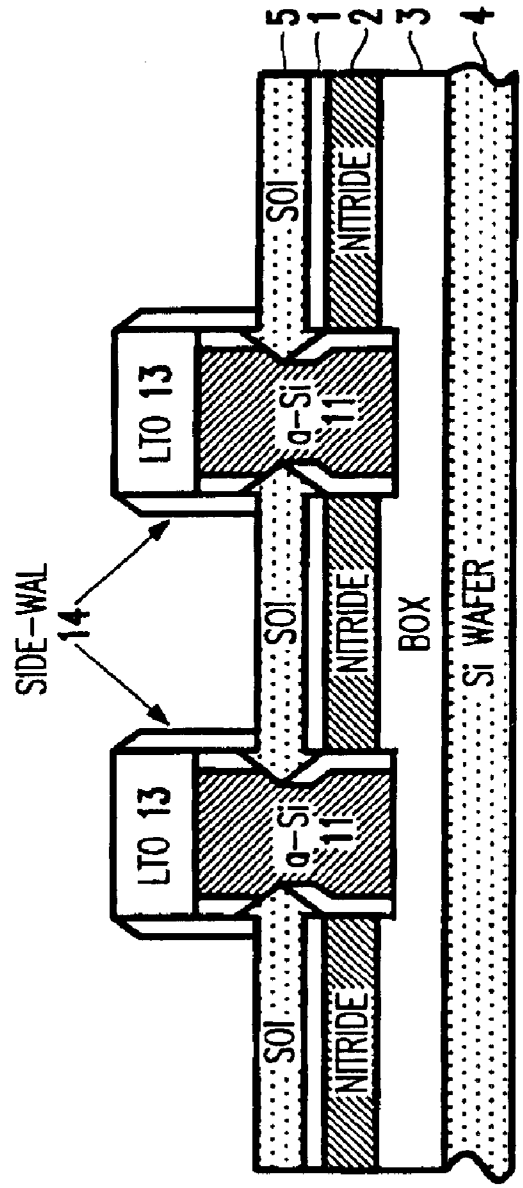
FIG. 16 is a schematic diagram depicting side-wall formation.
Figure 17:
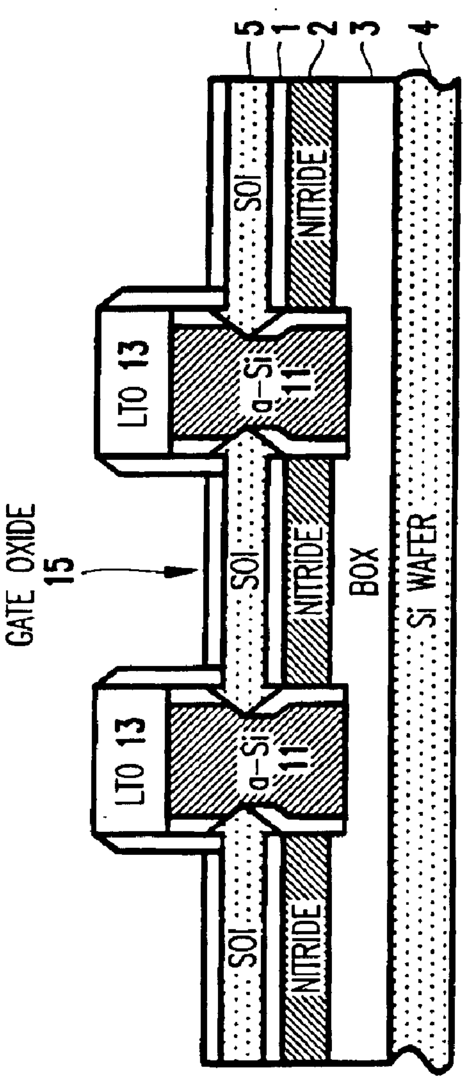
FIG. 17 is a schematic diagram depicting the structure after the growth of the top gate dielectric.
Figure 18:
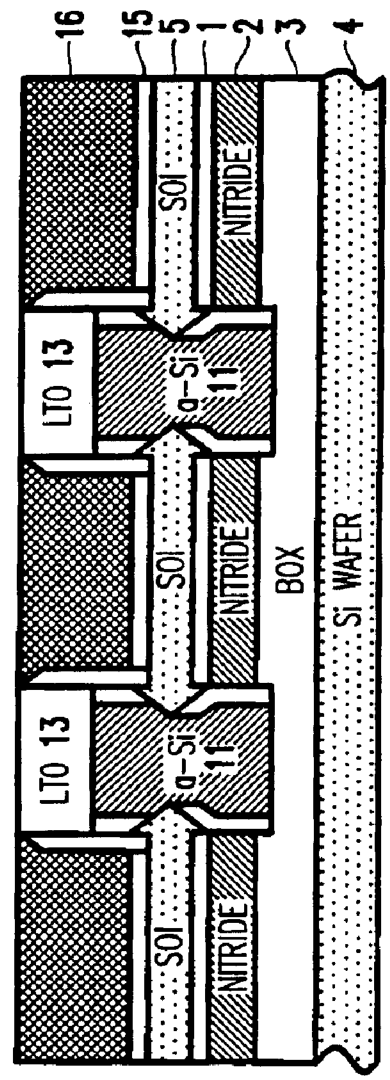
FIG. 18 is a schematic diagram depicting the structure after the deposition of the top gate material and its planarization by CMP.

Also, the invention reshapes the top portion of the structure as shown in FIG. 15. This is done by, first, removing the top nitride 7 by wet chemical etching (e.g. hot phosphoric acid). Second, side-walls 14 are formed as depicted in FIG. 16. The walls are formed by depositing a dielectric conformally onto the entire structure and then etching the dielectric to form side-walls. The thickness of the dielectric determines the thickness of the side-walls 14. Third, the top sacrificial pad oxide 6 is removed by wet chemical etch (e.g. hydrofluoric acid). Next, a top gate dielectric 15 is grown onto the top surface of the SOI channel 5 as shown in FIG. 17. The top gate material 16 (e.g. doped polysilicon or tungsten) is conformally deposited to form the gate electrode as shown in FIG. 18. Finally, chemical-mechanical polishing is used to planarize the top surface. The CMP process mainly removes the top gate material using a slurry that is selective to nitride 7.

Figure 19:
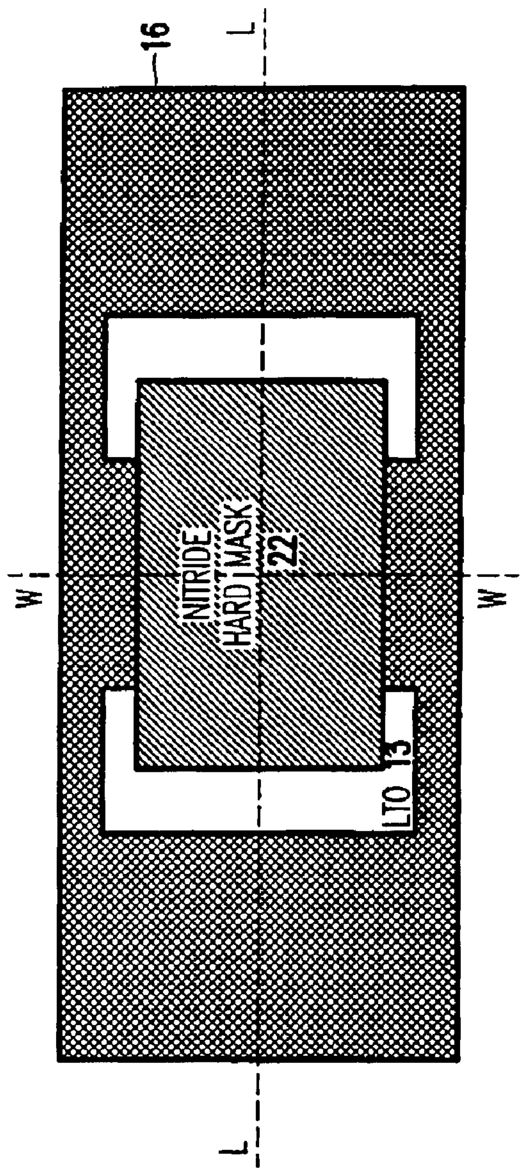
FIG. 19 is a schematic diagram depicting the structure with the nitride hard mask that is used to define the device mesa.
Figure 20:
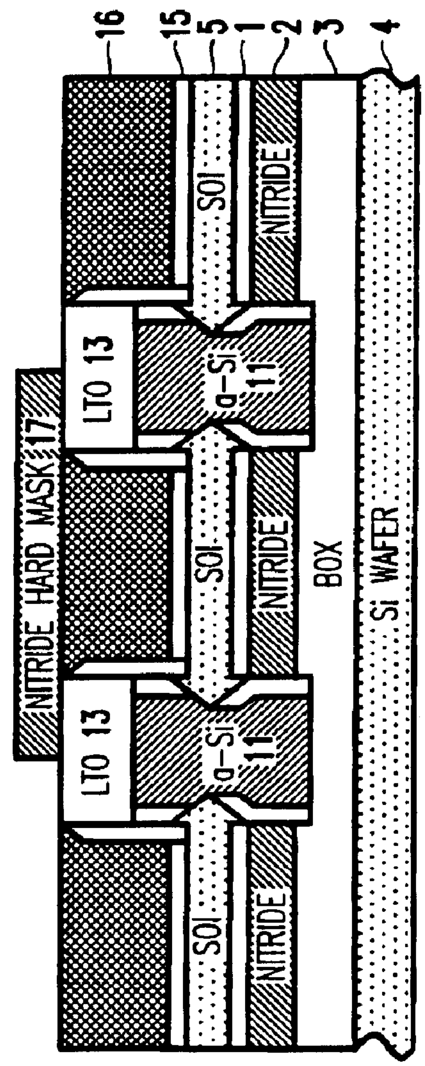
FIG. 20 is a schematic diagram depicting a cross section of FIG. 19 along line L—L.

Subsequently, the invention places a mesa hard mask 17 onto the structure as shown in FIGS. 19 and 20. The mesa hard mask is comprised of a deposition nitride film which is preferably about 100 nm thick and is subsequently patterned. FIGS. 22, 24, 26, 28, 30, 32, 42, 44, 46, and 48 are cross-sectional views along line W—W, shown in FIG. 19.

Figure 21:
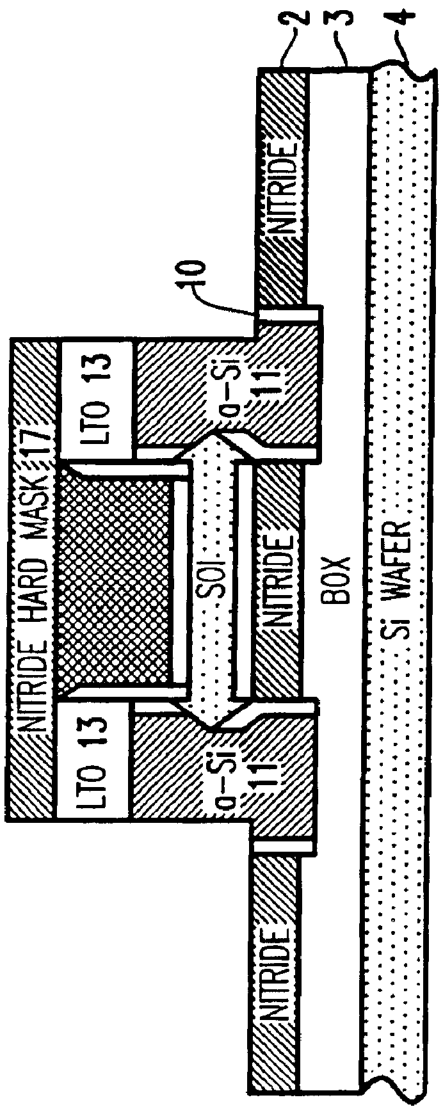
FIG. 21 is a schematic diagram depicting the structure along line L—L after the mesa etch.
Figure 22:
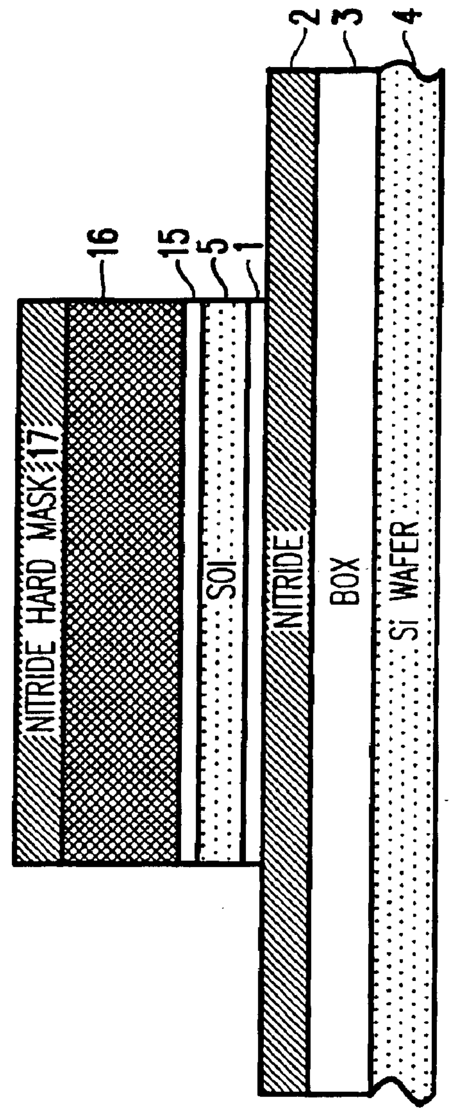
FIG. 22 is a schematic diagram depicting the structure along line W—W after the mesa etch.
Figure 23:
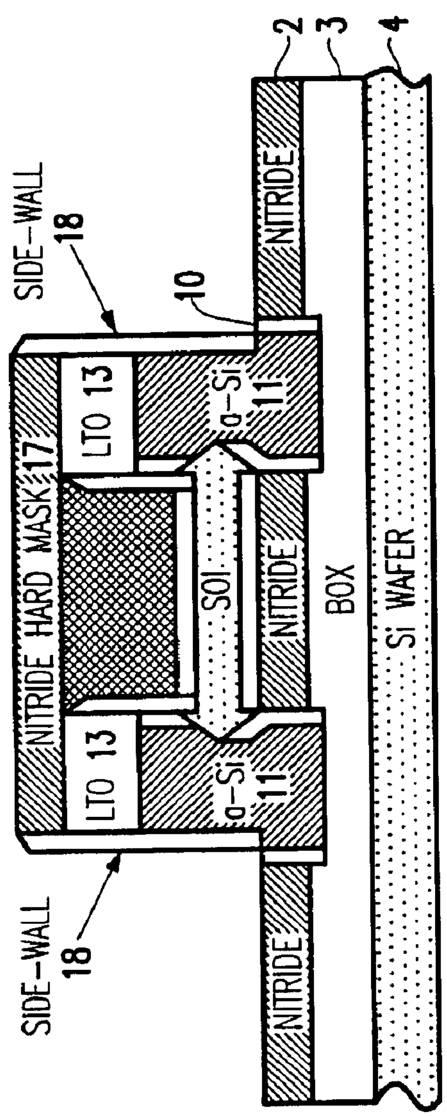
FIG. 23 is a schematic diagram depicting the side-wall along line L—L.
Figure 24:
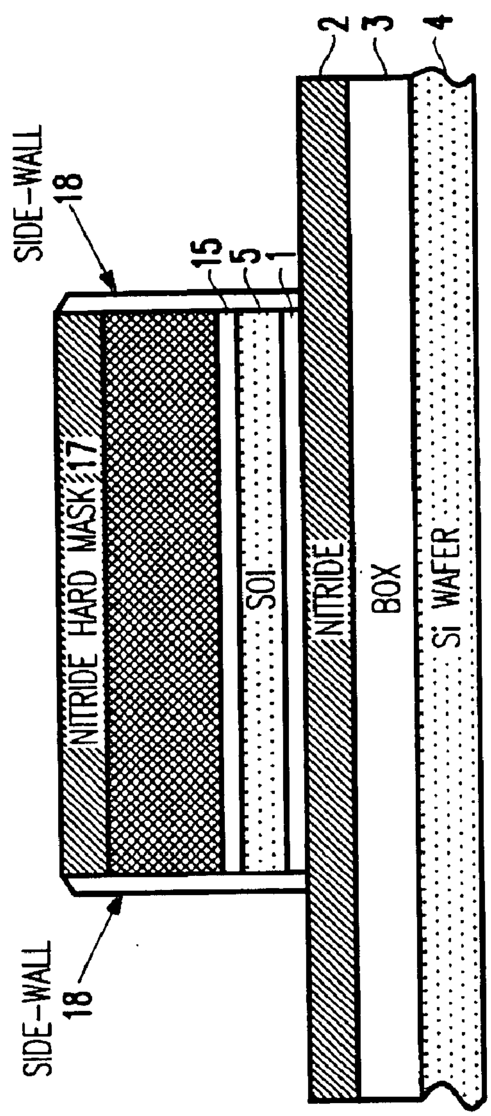
FIG. 24 is a schematic diagram depicting the side-wall along line W—W.
Figure 25:
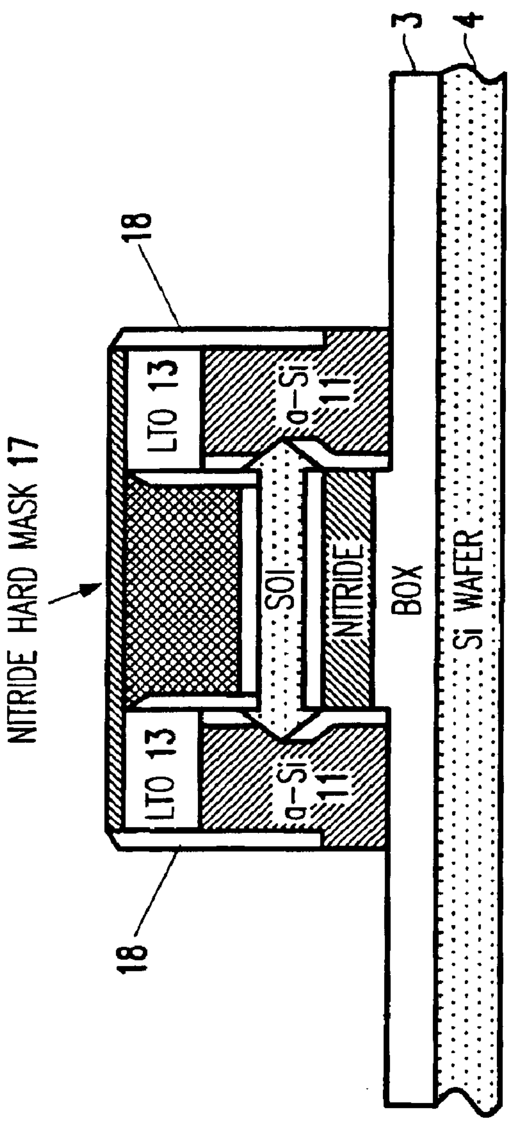
FIG. 25 is a schematic diagram depicting the structure along line L—L after the mesa etch was continued into the box.
Figure 26:
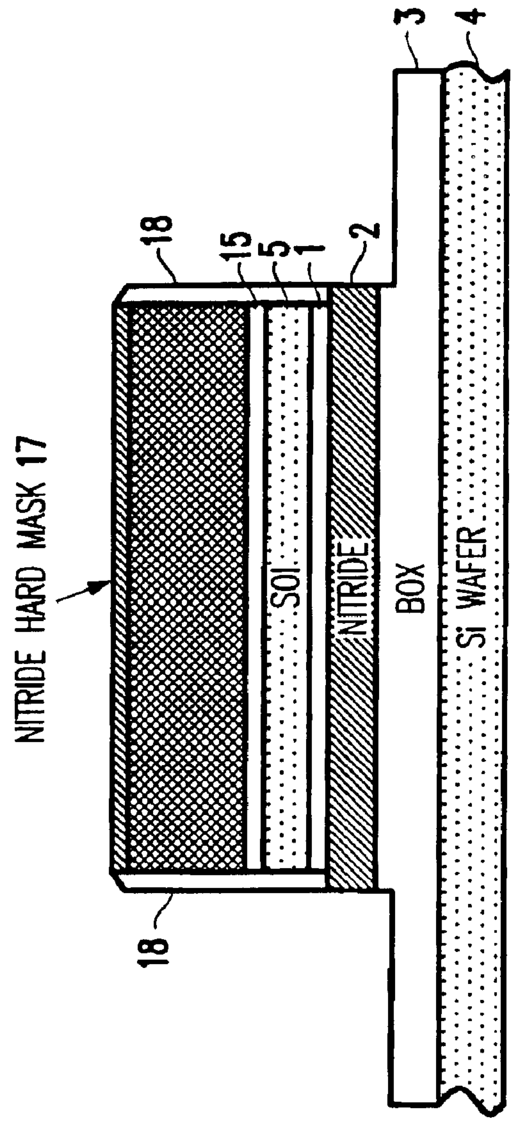
FIG. 26 is a schematic diagram depicting the structure along line L—L after the mesa etch was continued into the box.

More specifically, the invention isolates individual devices using the mesa hard mask 17. The structure is patterned as follows: (1) etching with reactive ion etching (RIE) past the SOI film and stopping on the nitride as shown in FIGS. 21 and 22; (2) depositing a dielectric such as low temperature oxide (LTO) of preferably about 75 nm conformally on the entire structure and etching the dielectric to form a sidewall 18 as shown in FIGS. 23 and 24; (3) completing the mesa etch by etching some distance into the BOX 3 as shown in FIGS. 25 and 26. The sidewall of the bottom nitride 2 is also exposed during this process.

Figure 27:
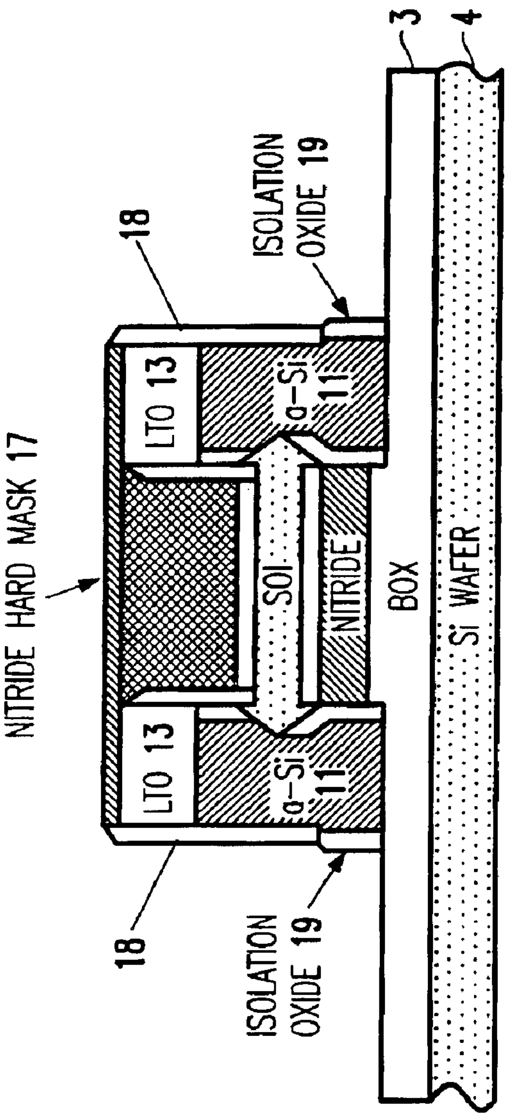
FIG. 27 is a schematic diagram depicting the structure along line L—L and the isolation of the exposed source and drain side-walls by oxidation.
Figure 28:
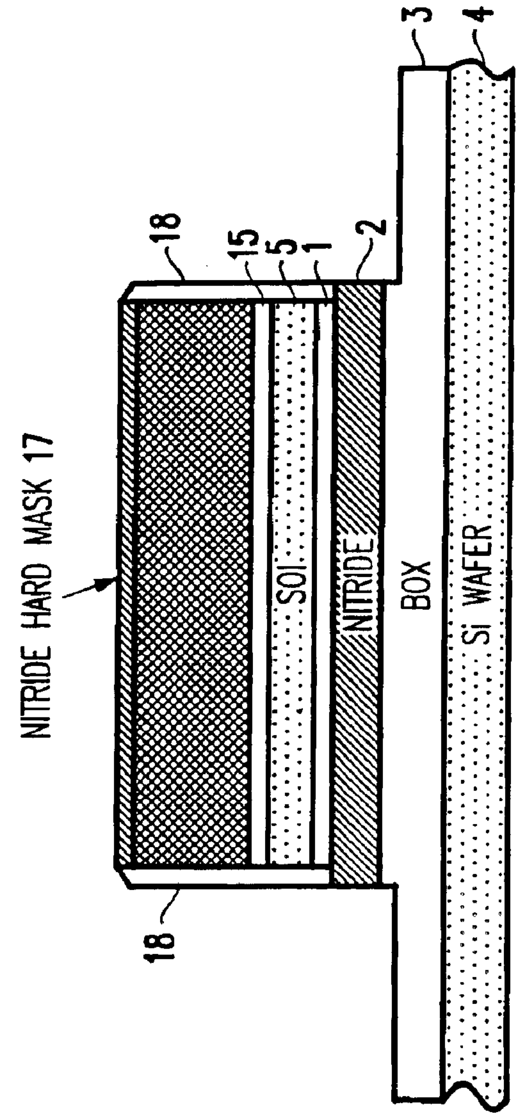
FIG. 28 is a schematic diagram depicting the structure along line W—W and the isolation of the exposed source and drain side-walls by oxidation.
Figure 29:
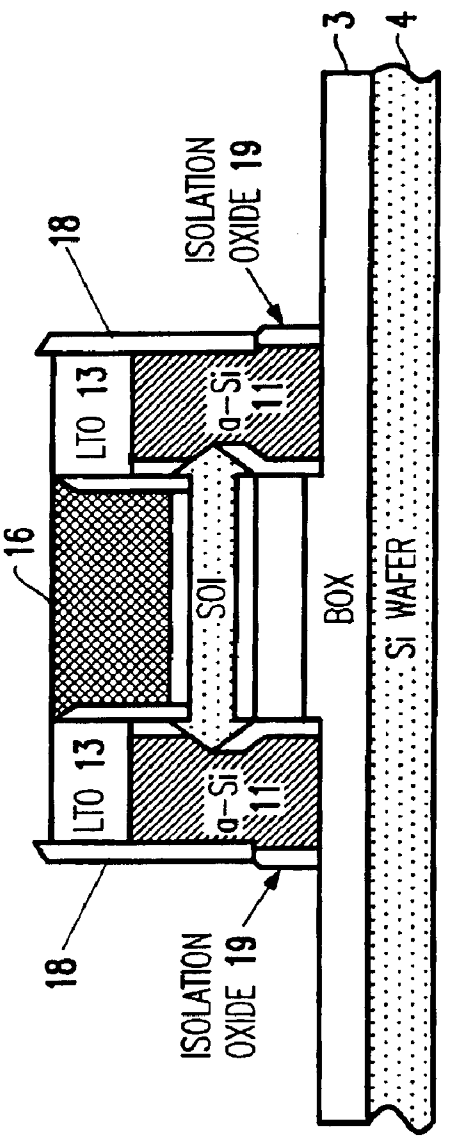
FIG. 29 is a schematic diagram depicting the structure along line L—L after the bottom nitride film was removed by wet etching.
Figure 30:
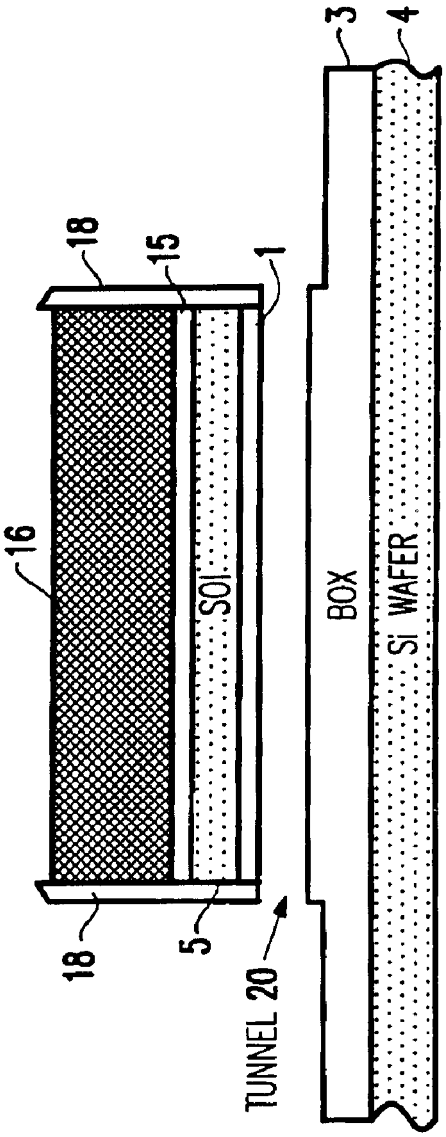
FIG. 30 is a schematic diagram depicting the structure along line W—W after the bottom nitride film was removed by wet etching.

As depicted in FIGS. 27 and 28, the invention grows a thermal oxide 19 to isolate the exposed source and drain side-wall. Then, as depicted in FIGS. 29 and 30, the invention removes the bottom nitride 2 and top nitride hard mask 17 by wet chemical etching (e.g., hot phosphoric acid). The removal of the bottom nitride 2 forms a tunnel 20 along the device in the width dimension and a suspended bridge along the length dimension. Also, the bottom sacrificial pad oxide 1 is removed by wet chemical etch (e.g. hydrofluoric add).

Figure 31:
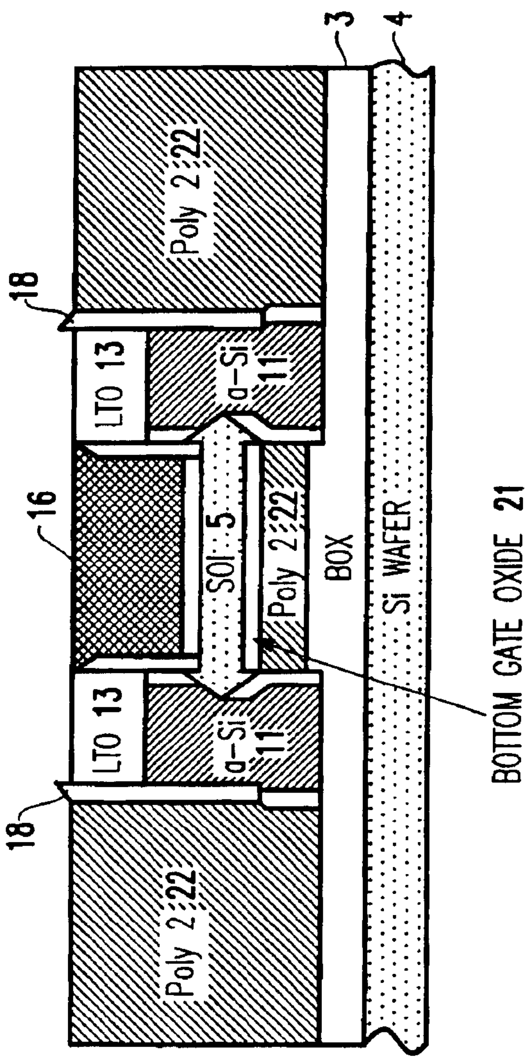
FIG. 31 is a schematic diagram depicting the structure along line L—L after the growth of the bottom gate dielectric; the deposition of the bottom gate material; and, its planarization by CMP.
Figure 32:
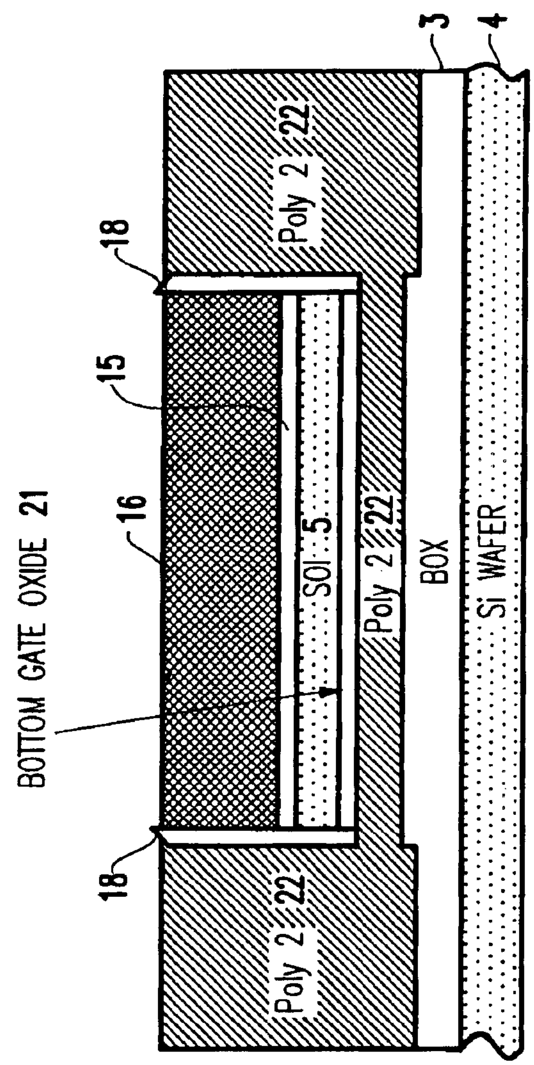
FIG. 32 is a schematic diagram depicting the structure along line W—W after the growth of the bottom gate dielectric; the deposition of the bottom gate material; and, its planarization by CMP.

Next, as shown in FIGS. 31 and 32, the invention forms the bottom gate electrode 22. This is done by first growing bottom gate dielectric 21 on the bottom surface of the SOI channel 5. The bottom gate material 22 (e.g. doped polysilicon, tungsten, etc.) is conformally deposited to form the bottom gate electrode. Next, CMP is used to planarize the top surface. The CMP process mainly removes the bottom gate material and is selective to the LTO 13.

Figure 33:
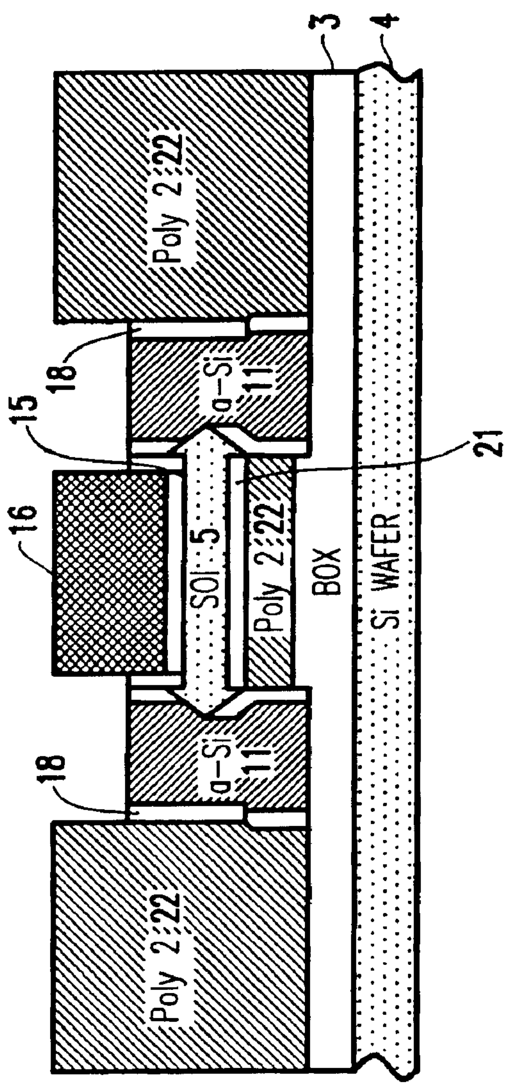
FIG. 33 is a schematic diagram depicting the structure along line L—L, after removal of the dielectric from the recessed region of the source drain and the formation of a side-wall.
Figure 34:
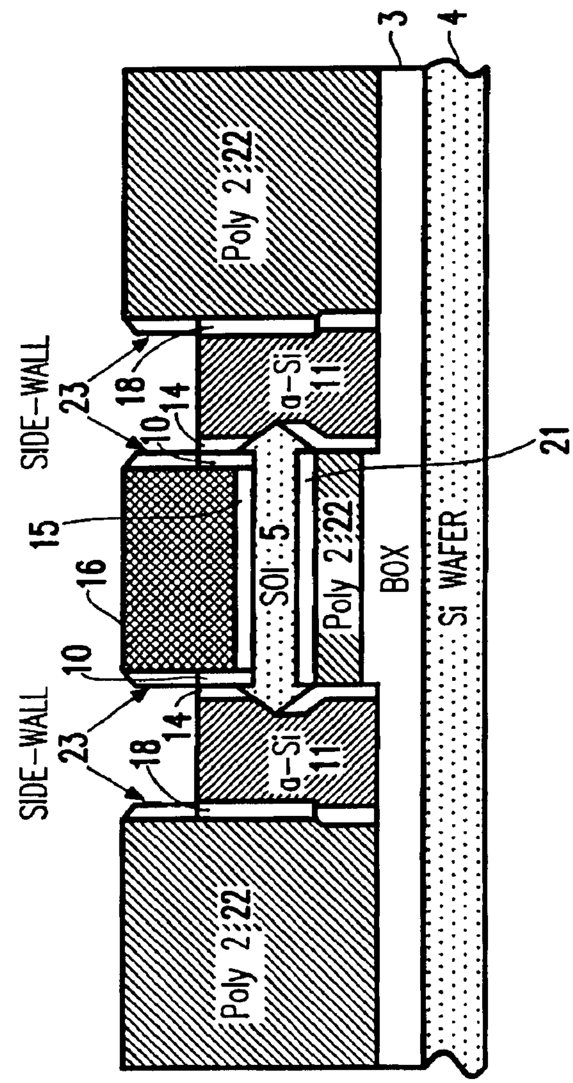
FIG. 34 is a schematic diagram depicting the structure along line W—W, after removal of the dielectric from the recessed region of the source drain and the formation of a side-wall.

As shown in FIG. 33, the invention etches the source/drain cap dielectric LTO 13. The invention deposits a dielectric conformally on the entire structure to form side-walls 23, as shown in FIG. 34. Once again, the thickness of this dielectric determines the resultant spacer thickness. The dielectric is then etched to form the final side-wall structure 23.

Figure 35:
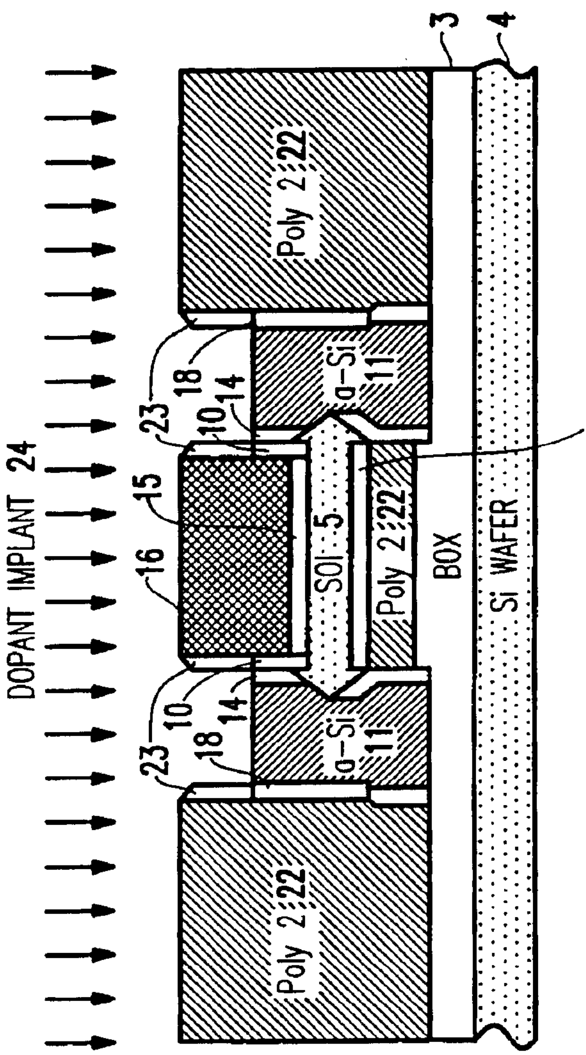
FIG. 35 is a schematic diagram depicting, along line L—L, the self-aligned source/drain implant.

Next the invention, dopes source/drain regions 11 using a self-aligned ion-implantation 24 to heavily dope the silicon 11 as shown in FIG. 35. To mask the SOI channel region from the ion implantation, the top poly gate 16 is used as a self-aligned implant mask. The side-wall spacer 23 will offset the source/drain implant from the channel region. The implant is followed by a rapid thermal annealing to activate the dopant.

Figure 36:
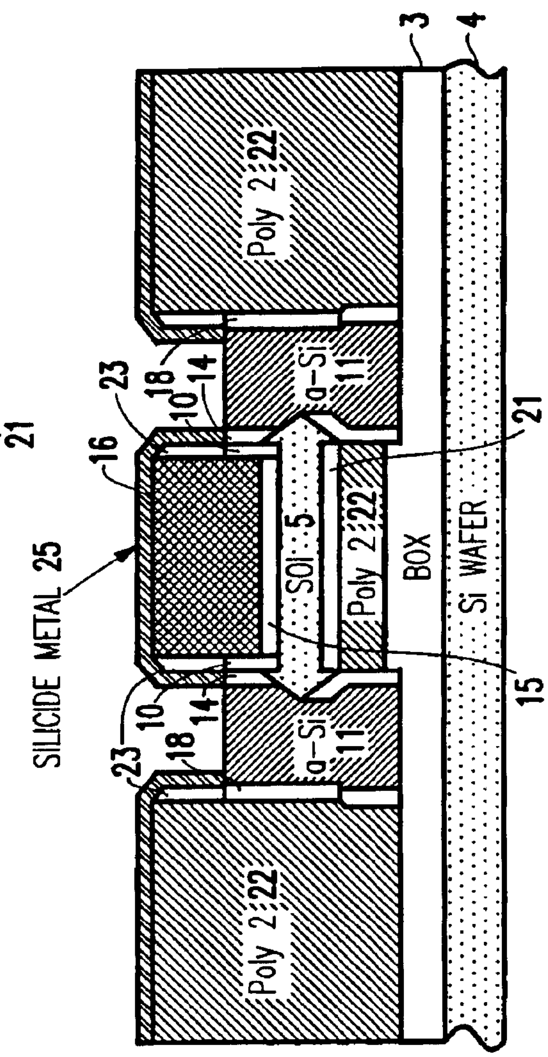
FIG. 36 is a schematic diagram depicting, along line L—L, the self-aligned silicide formation.
Figure 37:
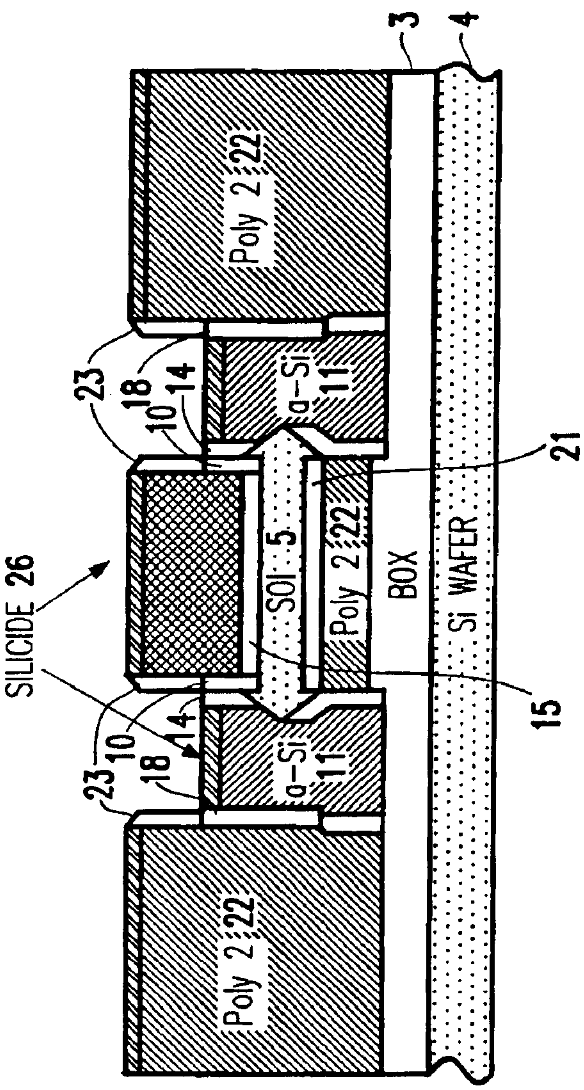
FIG. 37 is a schematic diagram depicting, along line L—L, the self-aligned silicide formation.
Figure 38:
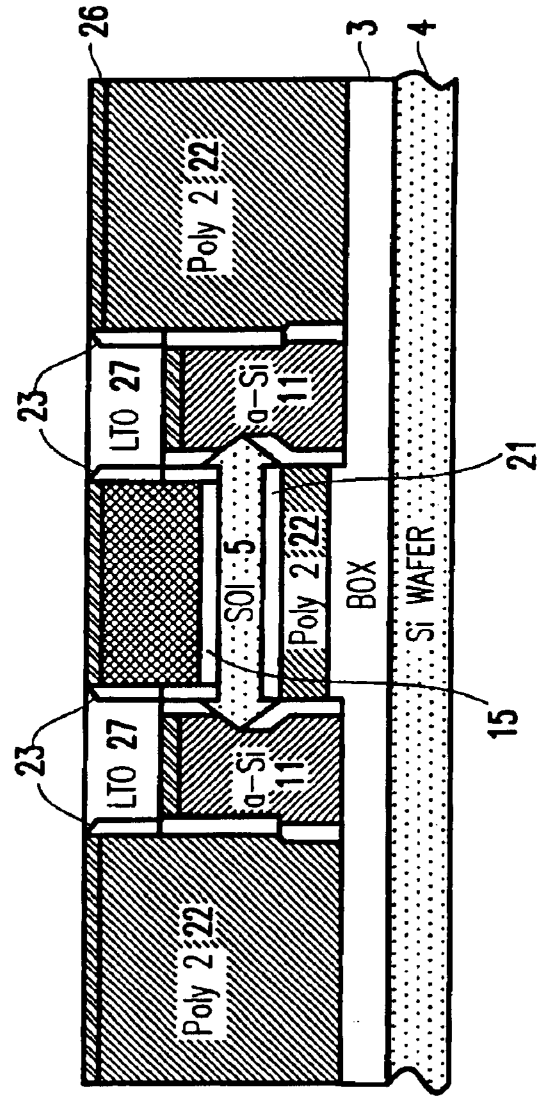
FIG. 38 is a schematic diagram depicting, along line L—L, that the recessed source and drain regions are re-filled with a dielectric material.

A self-aligned silicide process is then applied to form the silicide 26 over the source/drain and gates 11, as shown in FIG. 37. This is accomplished using any standard process well known to those skilled in the art. For example, in preparation for application of the silicide, a metal 25 such as cobalt (Co) or titanium (Ti) is deposited conformally on the entire structure as shown in FIG. 36 and the structure is heated. After the silicide is deposited, a dielectric such as LTO is conformally deposited over the silicide to form an LTO cap 27, shown in FIG. 38. This is followed by CMP which is used to planarize the top surface. The CMP process mainly removes the dielectric material 27 and is selective to the silicide 26 and/or the gate materials 16 and 22. Due to a finite selectivity of the CMP process some or all of the gate silicide 26 may be removed. In this case, the self-aligned silicide process may be repeated to form a new gate silicide.

Figure 39:
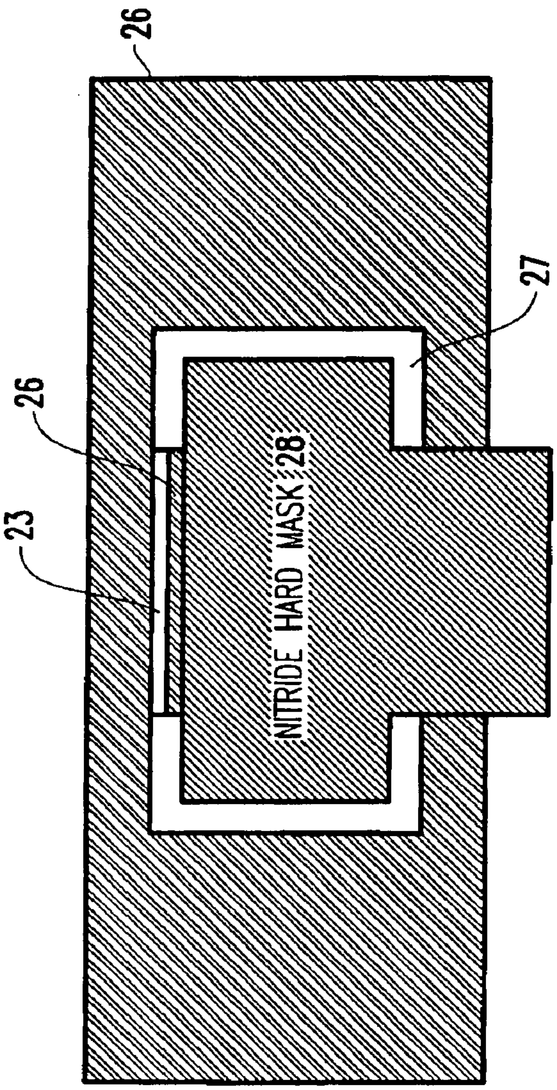
FIG. 39 is a schematic diagram depicting the top view and view along line L—L, of the nitride hard mask that is used for the etching of the excess bottom gate material.
Figure 40:
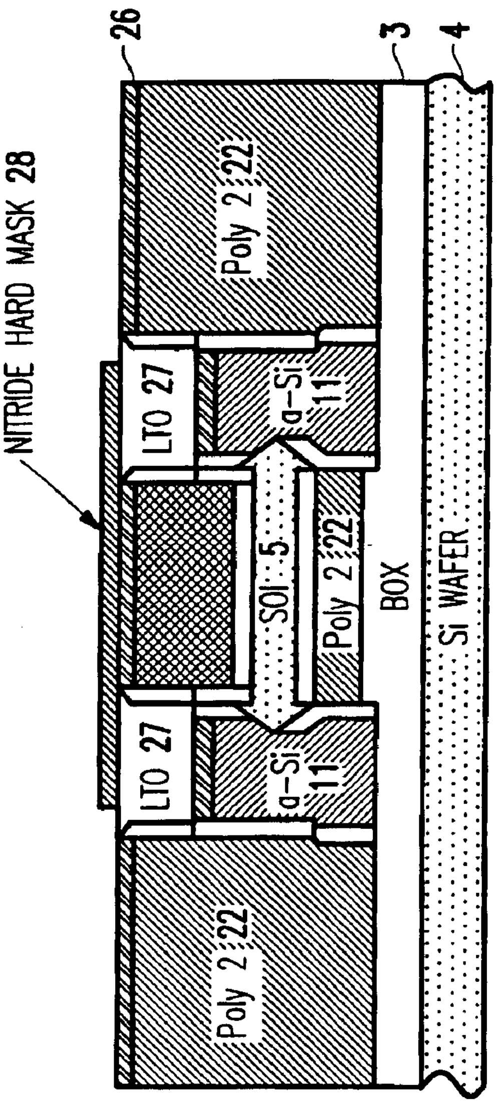
FIG. 40 is a schematic diagram depicting the top view along line W—W of the nitride hard mask that is used for the etching of the excess bottom gate material.
Figure 41:
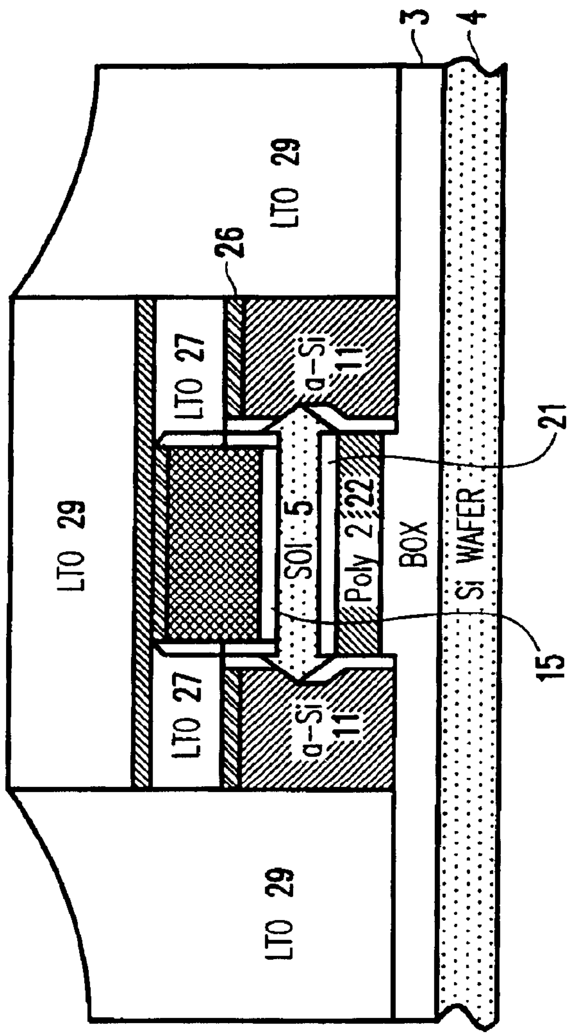
FIG. 41 is a schematic diagram depicting along line L—L the passivation and planarization of the device by a dielectric deposition and CMP.
Figure 42:
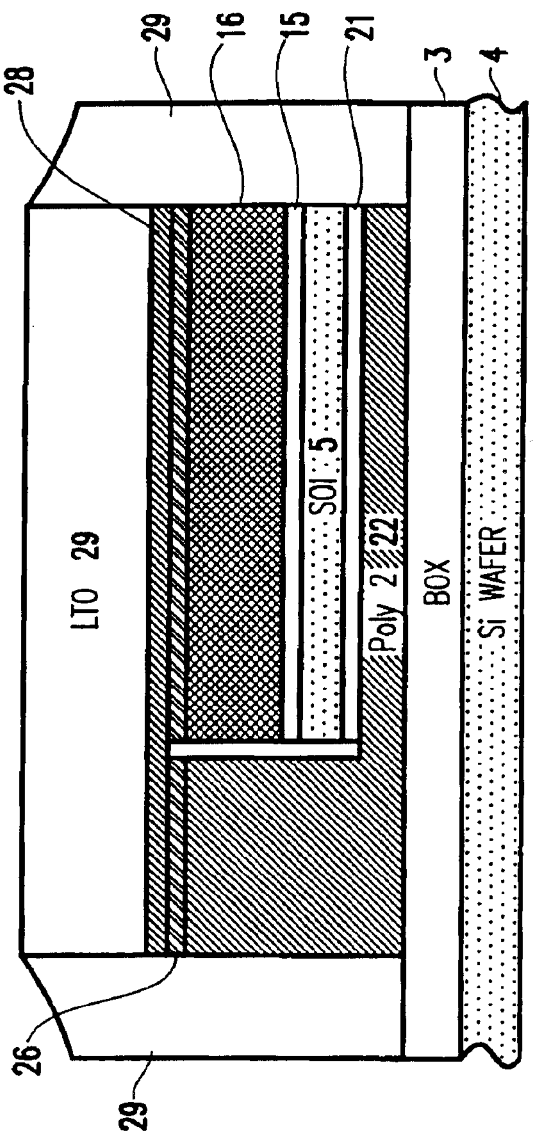
FIG. 42 is a schematic diagram depicting along line W—W the passivation and planarization of the device by a dielectric deposition and CMP.
Figure 43:
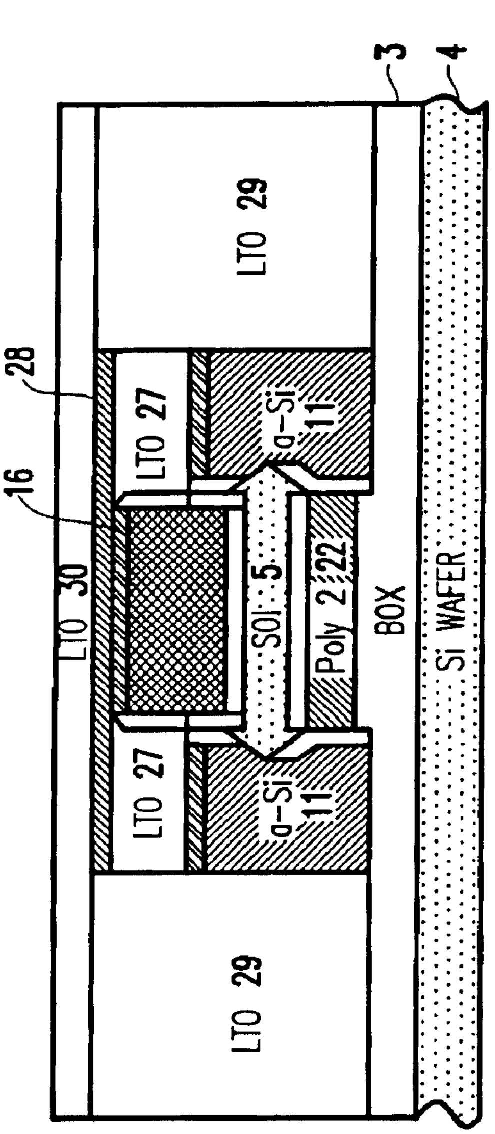
FIG. 43 is a schematic diagram depicting along line L—L the passivation and planarization of the device by a dielectric deposition and CMP.
Figure 44:
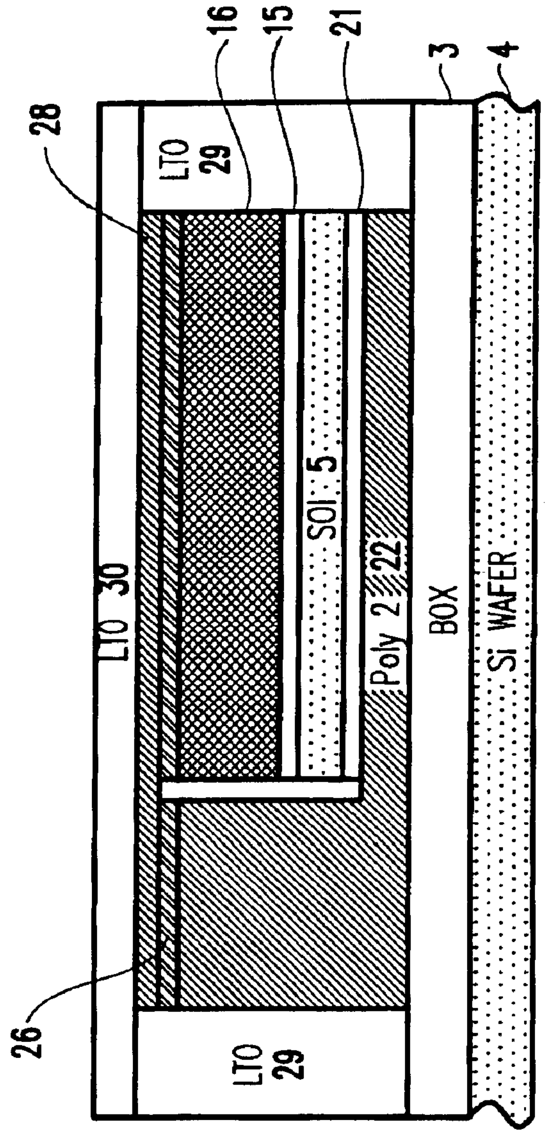
FIG. 44 is a schematic diagram depicting along line W—W the passivation and planarization of the device by a dielectric deposition and CMP.

Next, the bottom gate 22 is finalized. First, a nitride or LTO film 27 of preferably about 100 nm is deposited and subsequently patterned by photolithography to form a hard mask that defines the bottom gate area 28 as shown in top view in FIG. 39 and cross-section along line L—L in FIG. 40. Second, the excess bottom gate material 22 is etched down to the BOX 3, and a thick passivation dielectric is deposited 29 as shown in FIGS. 41 and 42. CMP is again used to planarize the top surface. The CMP process mainly removes the dielectric material 29 and is selective to not remove the nitride hard mask 28. A second passivation dielectric is then deposited 30 as shown in FIGS. 43 and 44.

Figure 45:
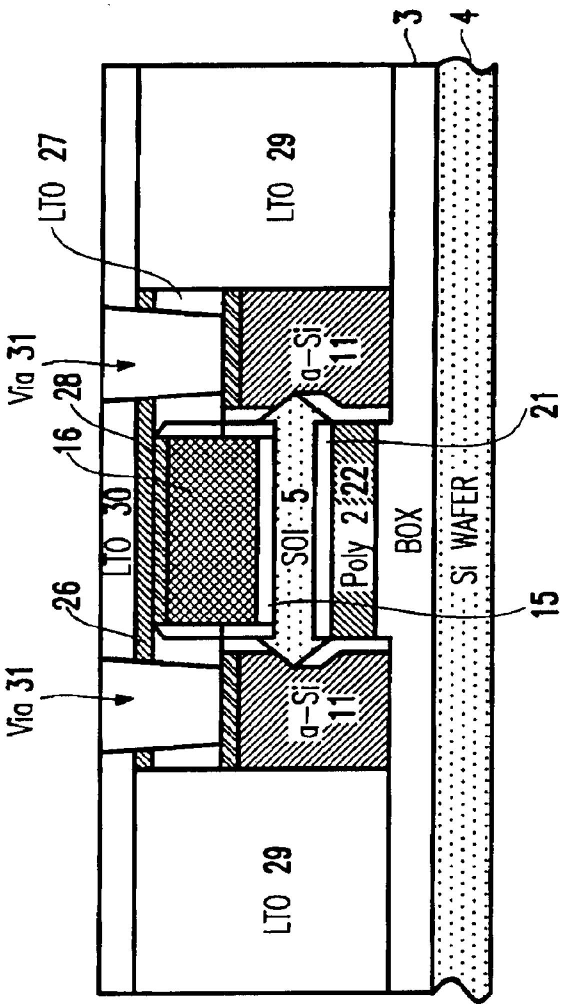
FIG. 45 is a schematic diagram depicting the contact hole (via) opening used to contact the device source, drain and the top and bottom gates.
Figure 46:
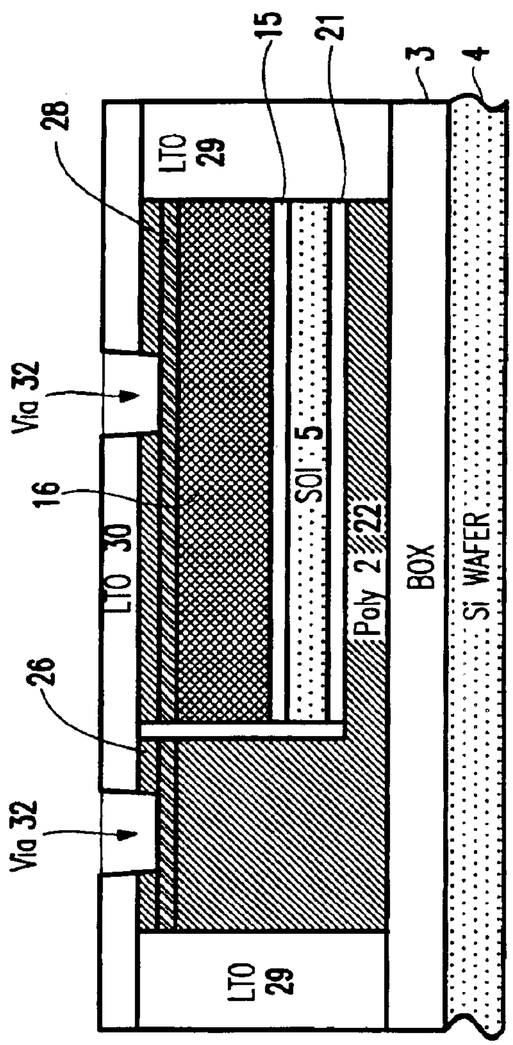
FIG. 46 is a schematic diagram depicting the contact hole (via) opening and used to contact the device source, drain and the top and bottom gates.
Figure 47:
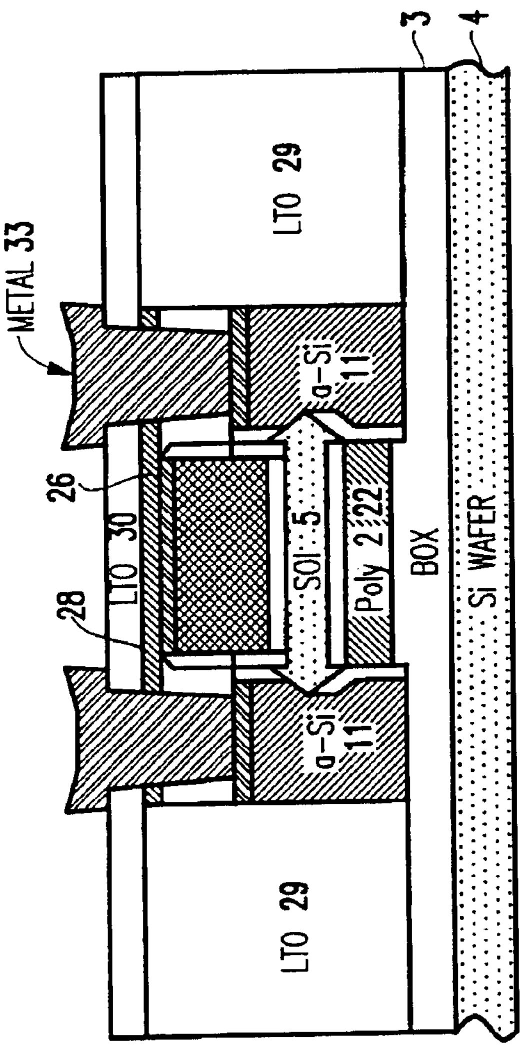
FIG. 47 is a schematic diagram depicting the contact hole (via) opening and the metalization used to contact the device source, drain and the top and bottom gates.
Figure 48:
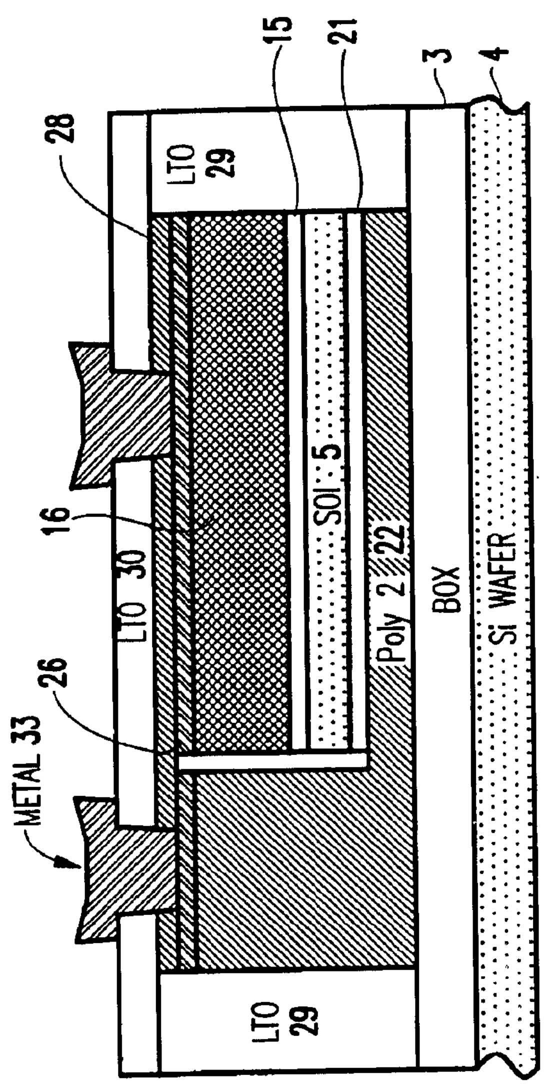
FIG. 48 is a schematic diagram depicting along line W—W the partially completed structure according to the invention.
Figure 49:
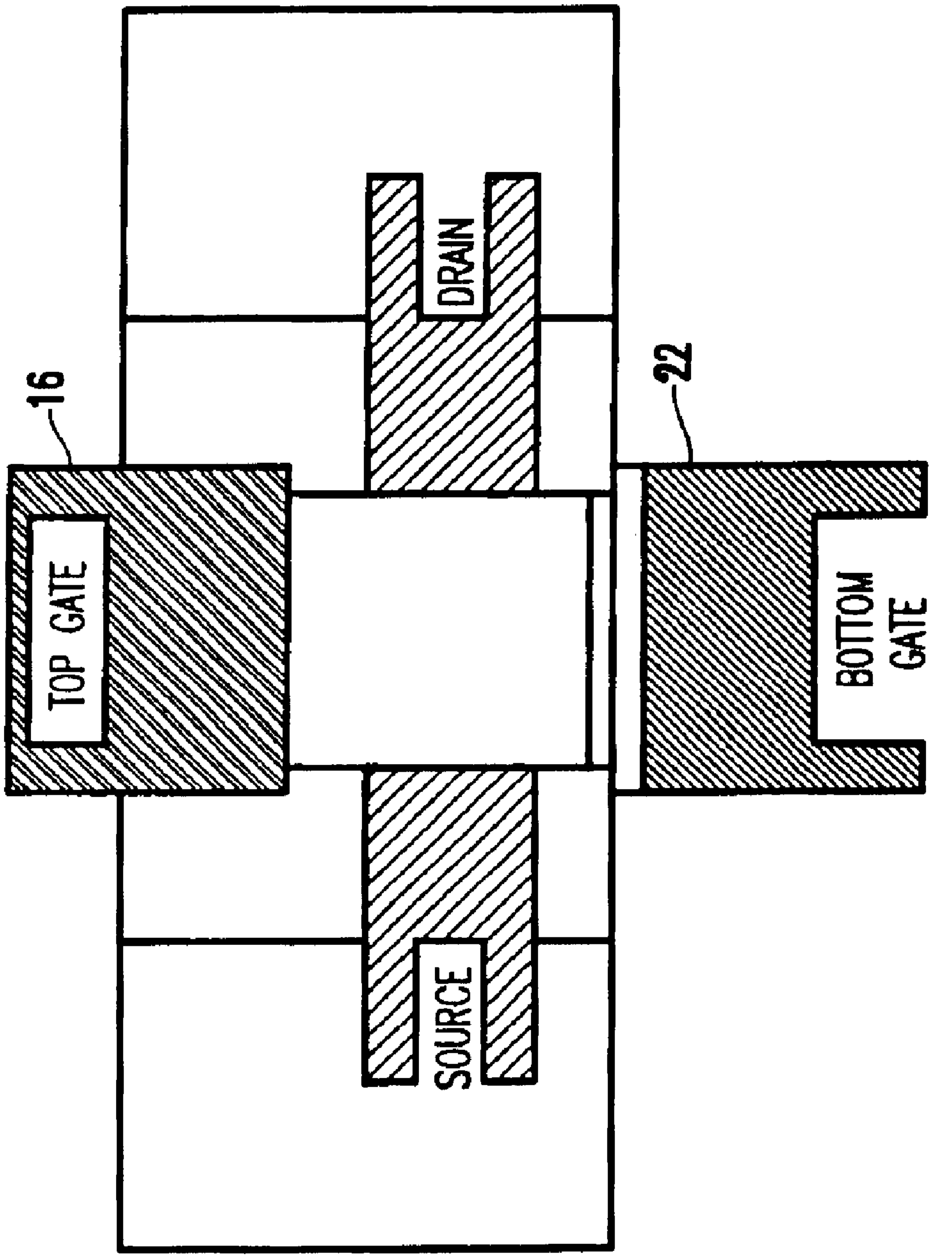
FIG. 49 is a schematic top view of the inventive structure.

Next, contact holes 31 are formed on the source, and drain 11, and contact holes 32 are etched over the two gates 16, 22, by photo-lithography patterning and etching as shown in FIGS. 45 and 46. Metalization 33 is then deposited and subsequently patterned to form electrical contacts to the source, the drain, and the bottom and top gates electrodes as shown in FIGS. 47 and 48. If the gate length is very short, two levels of metalization may be applied to allow for more relaxed design rules for the contact of the top gate. FIG. 49 shows a top view of the completed structure.

Many benefits over the prior art are realized by the specific improvements of this invention. First, this invention deposits the top and bottom gates in two separate steps and creates top and bottom gates that are electrically separated, which results in several advantages. For example, the bottom gate may be used to control the threshod voltage, thereby allowing a mix threshold voltage (Vt) circuit for low power applications.

This structure also allows for increases in the circuit density. When gates are electrically separated the double-gate MOSFET comprises a four terminal device with two input gates. Thus, a single device can be used to implement binary logic operations such as a NOR (nFET) or a NAND (pFET) cell. The implementation of these binary logic functions would typically require two standard MOSFETs per cell. This increase in the circuit density also applies to analog circuits. For example a mixer may be implemented by applying the oscillator voltage to one gate and the signal (data) voltage to the other gate.

Since the invention grows the top and bottom gates and respective gate dielectrics independently, the gates and gate dielectrics may be of different materials and different thicknesses. Also different doping levels and doping species may be incorporated into each gate. Thus, asymmetric gates may be fabricated. The asymmetric double-gate MOSFET is most useful for a mixed application where the gates are tied together to achieve speed and can be used separately to achieve low power and high density e.g. for static random access memory (SRAM).

Also, the invention provides a structure that is planar, making it easier to connect the device. Devices with a very thin channel of about 3 to 5 nm thick may be required to obtain a good threshold voltage behavior. Fabricating suspended silicon bridges with a thin layer may reduce the overall yield. This invention supports the channel with a thick layer 22. Thus, the invention allows devices with a very thin channel to be fabricated and permits such devices to obtain a good threshold voltage behavior. The invention also utilizes a self-aligned silicide process which lowers the series resistance.

While the invention has been described in terms of preferred embodiments, those skilled in the art will recognize that the invention can be practiced with modification within the spirit and scope of the appended claims.

What is claimed is:

1. A transistor comprising:

a channel region;

a first gate on top of said channel region;

a second gate below said channel region; and source and drain regions laterally adjacent said channel region, wherein said channel region includes an extension into said source and drain regions, and wherein said first gate comprises the same material as said second gate, and has a different doping concentration than said second gate.

2. The transistor of claim 1, wherein said first gate comprises a different doping species than said second gate.

3. The transistor of claim 1, further comprising a first gate dielectric below said first gate and a second gate dielectric above said second gate.

4. The transistor of claim 1, wherein said first gate comprises a different thickness than said second gate.

5. The transistor of claim 1, wherein said first gate, said second gate and said channel region form a planarized structure.

6. A transistor comprising:

a channel region;

a first gate on top of said channel region;

a second gate below said channel region; and source and drain regions laterally adjacent said channel region, wherein said channel region includes an extension into said source and drain regions, and wherein said first gate has a first conductive contact and said second gate has a second conductive contact and said first conductive contact and said second conductive contact are coplanar.

7. A transistor comprising:

a channel region;

a first gate on top of said channel region;

a second gate below said channel region; and source and drain regions laterally adjacent said channel region, wherein said channel region includes an extension into said source and drain regions, and wherein said first gate comprises a different material than said second gate.

8. A transistor comprising:

a channel region;

a first gate on top of said channel region; a second gate below said channel region;

source and drain regions laterally adjacent said channel regions; and a first gate dielectric below said first gate and a second gate dielectric above said second gate, wherein said channel region includes an extension into said source and drain regions, and wherein said first gate dielectric comprises a different material than said second gate dielectric.

9. A transistor comprising:

a channel region;

a first gate on top of said channel region;

a second gate below said channel region;

source and drain regions laterally adjacent said channel region; and a first gate dielectric below said first gate and a second gate dielectric above said second gate, wherein said channel region includes an extension into said source and drain regions, and wherein said first gate dielectric comprises a different thickness than said second gate dielectric.

10. A semiconductor chip having at least one transistor, said transistor comprising:

a channel region;

a first gate on top of said channel region;

a second gate below said channel region;

a first gate dielectric below said first gate;

a second gate dielectric above said second gate;

source and drain regions laterally adjacent said channel region; and source and drain dielectrics between said source and drain regions and said first gate and said second gate, wherein a thickness and material selection of said first gate dielectric and said second gate dielectric is independent of said source and drain dielectrics.

11. The semiconductor chip of claim 10, wherein said first gate and said second gate have different dopant concentrations.

12. The semiconductor chip of claim 10, wherein said first gate and said second gate have different dopant species.

13. The semiconductor chip of claim 10, wherein said first gate dielectric comprises a different material than said second gate dielectric.

14. The semiconductor chip of claim 10, wherein said first gate dielectric comprises a different thickness than said second gate dielectric.

15. The semiconductor chip of claim 10, wherein said first gate has a first conductive contact and said second gate has a second conductive contact and said first conductive contact and said second conductive contact are coplanar.

16. The semiconductor chip of claim 10, wherein said first gate and said second gate are electrically separated.

17. The semiconductor chip of claim 10, wherein said first gate and said second gate have different thicknesses.

18. The semiconductor chip of claim 10, wherein said first gate, said second gate and said channel region form a planarized structure.

19. A transistor comprising:

a channel region;

a first gate on top of said channel region;

a second gate below said channel region;

an isolation layer below said second gate; and source and drain regions laterally adjacent said channel region, wherein said source and drain regions are self-aligned with said first gate and said second gate, such that said source and drain regions do not horizontally overlap said first gate or said second gate, and wherein said first gate and said second gate are electrically separated from each other, and wherein said channel region includes an extension into said source and drain regions.

20. The transistor of claim 19, wherein said first gate comprises a different doping species than said second gate.

21. The transistor of claim 19, further comprising a first gate dielectric below said first gate and a second gate dielectric above said second gate.

22. The transistor of claim 21, wherein said first gate dielectric comprises a different material than said second gate dielectric.

23. The transistor of claim 21, wherein said first gate dielectric comprises a different thickness than said second gate dielectric.

24. The transistor of claim 19, wherein said first gate has a first conductive contact and said second gate has a second conductive contact and said first conductive contact and said second conductive contact are coplanar.

25. The transistor of claim 19, wherein said first gate comprises a different material than said second gate.

26. The transistor of claim 19, wherein said first gate comprises a different thickness than said second gate.

27. The transistor of claim 19, wherein said first gate, said second gate and said channel region form a planarized structure.

28. A transistor comprising:

a substrate having a crystal orientation;

a single crystal channel above said substrate, wherein the crystal orientation of said single crystal channel is independent of said crystal orientation of said substrate;

a first gate above said single crystal channel; and a second gate below said single crystal channel, wherein said first gate comprises the same material as said second gate, and has a different doping concentration than said second gate.

29. A transistor comprising:

a channel region;

a first gate on top of said channel region;

a second gate below said channel region;

an isolation layer below said second gate; and source and drain regions laterally adjacent said channel region, wherein said source and drain regions are self-aligned with said first gate and said second gate, such that said source and drain regions do not horizontally overlap said first gate or said second gate, wherein said first gate and said second gate are electrically separated from each other, and wherein said first gate comprises the same material as said second gate, and has a different doping concentration than said second gate.

30. The transistor of claim 29, wherein said first gate comprises a different doping species than said second gate.

31. The transistor of claim 29, further comprising a first gate dielectric below said first gate and a second gate dielectric above said second gate.

32. The transistor of claim 31, wherein said first gate dielectric comprises a different material than said second gate dielectric.

33. The transistor of claim 31, wherein said first gate dielectric comprises a different thickness than said second gate dielectric.

34. The transistor of claim 29, wherein said first gate has a first conductive contact and said second gate has a second conductive contact and said first conductive contact and said second conductive contact are coplanar.

35. The transistor of claim 29, wherein said first gate comprises a different material than said second gate.

36. The transistor of claim 29, wherein said first gate comprises a different thickness than said second gate.

37. The transistor of claim 29, wherein said first gate, said second gate and said channel region form a planarized structure.

* * * * *